United States Patent
Sugizaki et al.

(10) Patent No.: US 6,541,393 B2
(45) Date of Patent: Apr. 1, 2003

(54) METHOD FOR FABRICATING SEMICONDUCTOR DEVICE

(75) Inventors: Taro Sugizaki, Kawasaki (JP); Toshiro Nakanishi, Kawasaki (JP); Kyoichi Suguro, Yokohama (JP); Atsushi Murakoshi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 1 day.

(21) Appl. No.: 09/779,531

(22) Filed: Feb. 9, 2001

(65) Prior Publication Data

US 2001/0018274 A1 Aug. 30, 2001

(30) Foreign Application Priority Data

Feb. 29, 2000 (JP) ........................... 2000-052861

(51) Int. Cl.$^7$ ..................... H01L 21/31; H01L 21/469
(52) U.S. Cl. .............. 438/763; 438/275; 438/286; 438/773; 438/774
(58) Field of Search ................... 438/763, 770, 438/773, 774, 286, 981, 275

(56) References Cited

U.S. PATENT DOCUMENTS

| | | | |
|---|---|---|---|
| 5,739,580 A | * | 4/1998 | Aronowitz et al. ......... 257/647 |
| 6,143,669 A | | 11/2000 | Cho |
| 6,150,220 A | | 11/2000 | Huh et al. |
| 6,191,049 B1 | | 2/2001 | Song |

FOREIGN PATENT DOCUMENTS

| | | |
|---|---|---|
| JP | 06350079 A | 12/1994 |
| JP | 11102970 A | 4/1999 |
| JP | 11233642 A | 8/1999 |
| JP | 11260813 A | 9/1999 |
| JP | 11260813 * | 9/1999 |
| JP | 11289090 A | 10/1999 |
| TW | 324839 | 1/1998 |

OTHER PUBLICATIONS

Taiwanese Office Action dated Mar. 1, 2002

* cited by examiner

Primary Examiner—Alexander Ghyka
(74) Attorney, Agent, or Firm—Armstrong, Westerman & Hattori, LLP

(57) ABSTRACT

A semiconductor device is fabricated by a method comprising the steps of: selectively introducing a halogen element or argon into a device region 14 of a silicon substrate 10; and wet oxidizing the silicon substrate 10 in an ambient atmosphere which an $H_2O$ partial pressure is less than 1 atm to thereby form a silicon oxide film 22 in the device region 14 of the silicon substrate 10, and a silicon oxide film 24 thinner than the silicon oxide film 22 in a device region 16 of the silicon substrate 10. Whereby the silicon oxide film in a device region 14 with the halogen element or argon introduced can be selectively formed thick. The silicon oxide films are formed by the wet oxidation, whereby the gate insulation films can be more reliable than those formed by the dry oxidation.

17 Claims, 25 Drawing Sheets

METHOD FOR FABRICATING SEMICONDUCTOR DEVICE

BACKGROUND OF THE INVENTION

The present invention relates to a method for fabricating a semiconductor device, more specifically to a method for fabricating a semiconductor device comprising gate insulation films having different film thicknesses from each other.

In recent semiconductor devices, gate insulation films have different film thicknesses from each other for improved device characteristics, etc. In DRAM, for example, it is preferable for improved operation speed to form, as the peripheral circuit transistors, transistors having the gate insulation film made thinner. On the other hand, it is preferable that the memory cell transistors have the gate insulation film made thicker than the peripheral circuit transistors, because the memory cell transistors having the gate insulation film made as thin as the peripheral circuit transistors have too low threshold voltage, which deteriorates controllability and refresh characteristics. In non-volatile semiconductor devices, such as EEPROM, flash EEPROM, etc., in addition to the above-described requirement for the peripheral circuit transistors and the memory cell transistors, transistors having the gate insulation film which is thicker than the transistors forming the memory cell transistors and logics of the peripheral circuits are required as high breakdown voltage transistors used in writing/erasing.

Conventional techniques for forming gate insulation films having different film thickness from each other are a technique wherein a silicon oxide film is formed uniformly on an entire surface and removed in a region, and then additionally oxidized to thereby provide a difference in film thickness between the region for the silicon oxide film removed and the rest region, and techniques using enhanced oxidation and retarded oxidation by ion implantation. It is preferable from the viewpoint of throughputs to use the techniques using enhanced oxidation and retarded oxidation by ion implantation.

In the techniques using ion implantation, it has been proposed that nitrogen ions are implanted in a silicon substrate before a gate insulation film is formed to thereby suppress the following oxidation (retarded oxidation), and argon ions are implanted in a silicon substrate before a gate insulation film is formed to thereby enhance the following oxidation (enhanced oxidation). In the specification of laid-open Japanese Patent Application No. Hei 11-260813/1999 and the specification of Japanese Patent No. 2950101, a technique wherein fluorine ions are implanted in a silicon substrate before a gate insulation film is formed to thereby enhance the following oxidation is proposed. Such ion implantation is performed selectively in a specific region, whereby a gate insulation film of silicon oxide film which is thicker or thinner in an ion-implanted region than in the rest region can be formed.

Thus, by the conventional method for fabricating a semiconductor device, wherein the gate insulation film is formed by using the enhanced oxidation or retarded oxidation by ion implantation, the gate insulation films having different film thicknesses from each other can be formed by one thermal oxidation step.

However, the conventional semiconductor device fabrication method using the retarded oxidation by nitrogen ion implantation has often degraded reliability of the gate insulation film. The conventional semiconductor device fabrication method using the enhanced oxidation by argon ion implantation has often increased gate leak current. The conventional semiconductor device fabrication method using argon ion implantation produces a relatively small film thickness difference of about 10% between a region with ions implanted and a region without the ion implantation. A technique for ensuring larger film thickness differences has been required.

Usually, wet oxidation film is more reliable than dry oxidation film, and the oxidation technique for forming a gate insulation film is preferably wet oxidation. However, in a case that the above-described method uses wet oxidation, the effect of the enhanced oxidation by ion implantation is much suppressed, and the merit of the ion implantation has not been produced. Accordingly, dry oxidation has been used for the oxidation for the enhanced oxidation, and the gate insulation film of high quality which is comparable to that of the wet oxidation film has not been produced.

SUMMARY OF THE INVENTION

An object of the present invention is to provide a semiconductor device fabrication method which can form gate insulation films having different film thicknesses from each other while retaining sufficient reliability and sufficient film thickness difference.

A first method for fabricating a semiconductor device according to the present invention is characterized mainly in that halogen ions are implanted before the thermal oxidation for forming a gate insulation film, and is also characterized in that wet oxidation under low pressure is applied to forming the gate insulation film.

Fluorine, which is one of VII-group elements (halogen), is added to a silicon oxide film in a suitable amount to thereby improve reliability thereof. Accordingly, the oxidation is enhanced by fluorine ion implantation, whereby reliability of the gate insulation film can be improved, and the gate insulation films having different film thicknesses from each other can be formed by one oxidation step. However, as described above, dry oxidation is used for the oxidation for the enhanced oxidation, and no silicon oxide film of good quality which is comparable to wet oxidation film can be formed.

In such circumstances, the inventors of the present application have made earnest studies and found for the first time that wet oxidation under low pressure or in an atmosphere of nitrogen or diluted with rare gas applied to forming a gate insulation film is very effectively for producing the effect of the enhanced oxidation.

The effect of the enhanced oxidation by the ion implantation is conspicuous in dry oxidation but is not in wet oxidation. This will be due to oxidizability difference between the two. That is, wet oxidation, which is more oxidizable than dry oxidation, advances the oxidation reaction so rapidly that an implanted element cannot affect the mechanism. Then, the inventors of the present application had an idea that oxidizability of wet oxidation is reduced so as to delay the oxidation reaction, whereby the enhanced oxidation effect by the ion implantation is allowed to be sufficiently exerted, and tested wet oxidation under low pressure or in an atmosphere of nitrogen or diluted with rare gas.

As a result, wet oxidation film could be formed without much suppressing the effect of the enhanced oxidation by fluorine ion implantation. Especially by suitably controlling conditions for the fluorine ion implantation, silicon oxide film can be made more reliable than that formed without the fluorine ion implantation.

It is preferable that the wet oxidation is conducted in an ambient atmosphere which an $H_2O$ partial pressure is less than 1 atm. A low pressure oxidation and a dilute oxidation may be applicable to such the wet oxidation. The low pressure wet oxidation used in this specification is wet oxidation made under low pressure, and a pressure in a film forming chamber is set to be, e.g., 1–400 Torr. The same effect can be produced by dilution with nitrogen, rare gas, such as argon, etc., or inactive gas so that an $H_2O$ partial pressure becomes less than 1 atm to prepare a steam partial pressure equivalent to the low pressure. It is possible that nitrogen, rare gas, such as argon, etc., or inactive gas is used under low pressure so as to use the synergetic effect. The diluent gases are not limited to rare gas or inactive gas. It is possible that oxygen or hydrogen may be also used as diluent gas. These gases have an effect of lowering the oxidation rate. It is possible that other additives, e.g., hydrogen chloride (HCl) may be incorporated in the atmosphere for the end of improving film quality of silicon oxide film, and other ends.

Wet oxidation film of good quality can be formed, producing the effect of the enhanced oxidation by the ion implantation, for example, at a 750° C. oxidation temperature, under a 40 Torr film forming chamber pressure, at a 3 liters hydrogen flow rate, at a 3 liters oxygen flow rate, at 20 liters nitrogen flow rate, and a 5% hydrogen chloride flow rate.

Then, the first method for fabricating a semiconductor device according to the present invention will be detailed below.

FIG. 1 is a graph of dose dependency of silicon oxide film thickness of samples each with a silicon oxide film formed by implanting fluorine ions at 5 keV acceleration energy through a 6 nm-thick sacrificial oxidation film and removing the sacrificial oxidation film and forming the silicon oxide film by low pressure wet oxidation or dry oxidation. In FIG. 1, the circles indicate the formation of the silicon oxide film by low pressure wet oxidation, and the squares indicate the formation of the silicon oxide film by dry oxidation.

As shown, both in the low pressure wet oxidation and the dry oxidation, the silicon oxide films increase thickness as the doses are increased. It is found that the enhanced-oxidation is caused by the fluorine ions implantation. At below an about $1\times10^{14}$ $cm^{-2}$ dose, the enhanced oxidation is below about 4%, and the effect is not conspicuous. At a $5\times10^{14}$ $cm^{-2}$ dose, a film thickness increase is about 20% for the dry oxidation and about 15% for the low pressure wet oxidation. At a $1\times10^{15}$ $cm^{-2}$ dose, the film thickness is further increased, and a film thickness increase is about 35% for the dry oxidation and about 20% for the low pressure wet oxidation.

FIG. 2 is a graph of acceleration energy dependency of silicon oxide film thickness of samples each with a silicon oxide film formed by implanting fluorine ions at a $5\times10^{14}$ $cm^{-2}$ dose through a 6 nm-thick sacrificial oxidation film, removing the sacrificial oxidation film and forming the silicon oxide film by low pressure wet oxidation.

As shown, a film thickness of the formed silicon oxide film increases as the acceleration energy increases and decreases when the acceleration energy exceeds about 10 keV. This is because when the acceleration energy is too low, nitrogen is mostly incorporated into the sacrificial oxidation film and cannot contribute to the oxidation reaction, and when the acceleration energy is too high, nitrogen is incorporated deep into a region of the substrate, which does not contribute to the oxidation reaction. Accordingly, it is preferable that conditions for the acceleration energy are selected so that many nitrogen atoms are incorporated into a region of the substrate, which contributes to the oxidation reaction. For example, when nitrogen ions are implanted with the sacrificial oxidation film of an about 6 nm-thick, it is preferable in FIG. 2 that the acceleration energy is set at about 5–10 keV.

From this viewpoint, a film thickness of the sacrificial oxidation film is set to be thinner than a projected range $R_p$ of nitrogen ions. Specifically, it is preferable that the acceleration energy of nitrogen ions are set so that a projected range $R_p$ of nitrogen ions is positioned at a depth of less than 10 nm from the interface between the sacrificial oxidation film and the silicon substrate. The sacrificial oxidation film is formed for the prevention of the substrate from being contaminated when the ions are implanted. Accordingly, when the ions can be implanted in a clean environment, the sacrificial oxidation film is not essential.

FIG. 3 is a graph of dose dependency of etching rates of a silicon oxide film with nitrogen ions implanted at 5 keV acceleration energy. The shown etched film thicknesses are equivalent to the etching amounts when the samples are etched by the etching condition of 10 nm-thick thermal oxidation film without nitrogen ions implanted.

As shown, as the dose of nitrogen ions increases, the etching rate of silicon oxide film much increases. The etching step of removing the sacrificial oxidation film is necessary after the nitrogen ion implantation and before the gate insulation film formation. In the etching step, the device isolation film as well as the sacrificial oxidation film is exposed to the etching. Accordingly, unpreferably for device isolation characteristics and surface planarity the device isolation film is etched at the high etching rate shown in FIG. 3. Accordingly, it is preferable that the sacrificial oxidation film is made as thin as possible so as to expose the device isolation film to the etching for a shorter period of time.

FIG. 4 is a graph of results of damage measured by thermal wave method, which was incorporated in the silicon substrate when fluorine ions are implanted in a $5\times10^{14}$ $cm^{-2}$ dose. AS shown, the damage in the substrate increases as the acceleration energy for the fluorine ions is increased. Accordingly, it is preferable from the viewpoint of less damage in the silicon substrate that the acceleration energy is set as low as possible.

FIG. 5 is a graph of reliability of silicon oxide films of samples measured by constant voltage TDDB (time dependent dielectric breakdown) method, each of which was formed by implanting fluorine ions at 5 keV acceleration energy and forming a 5 nm-thick silicon oxide film by low pressure wet oxidation. In FIG. 5, ● mark indicates the sample which fluorine ions are implanted at a dose of $1\times10^{14}$ $cm^{-2}$, □ mark indicates the sample which fluorine ions are implanted at a dose of $2\times10^{14}$ $cm^{-2}$, ■ mark indicates the sample which fluorine ions are implanted at a dose of $5\times10^{14}$ $cm^{-2}$, and △ mark indicates the sample which fluorine ions are implanted at a dose of $1\times10^{15}$ $cm^{-2}$. As a control, the reliability of a wet oxidation film formed without fluorine ion implantation is indicated by ○ mark. Oxidation conditions were controlled so that all the samples have a 5 nm-thick for the end of expelling influences due to differences in the film thickness. The MOS capacitor used for the measurement has an $N^+$ gate electrode formed on a p-type substrate interposing a silicon oxide film therebetween.

As shown, it is found that as the fluorine dose is increased from $1\times10^{14}$ $cm^{-2}$ to $2\times10^{14}$ $cm^{-2}$ dose and further to $5\times10^{14}$ $cm^{-2}$, the silicon oxide films have longer lifetimes.

However, when the dose is increased to $1\times10^{15}$ cm$^{-2}$, the lifetime is shortened by about one digit, and the silicon oxide film has poor quality than that of the sample without fluorine ions implanted. A detailed mechanism for implanted fluorine ions making a lifetime of silicon oxide film longer is not clear, but it will be a cause that suitable incorporation of fluorine in the interface between a silicon substrate and silicon oxide film improves interface characteristics. Accordingly, it is preferable that a dose of fluorine ions is set to be not less than $1\times10^{14}$ cm$^{-2}$ and less than $1\times10^{15}$ cm$^{-2}$.

FIG. 6 is a graph showing damages in the substrates measured by thermal wave method. The measurements are conducted before and after the silicon oxide film formation. In FIG. 6, ▽ mark indicates the damage incorporated immediately after the implantation, ○ mark indicates the damage after the 3 nm-thick silicon oxide film formation by the dry oxidation, □ mark indicates the damage after the 4 nm-thick silicon oxide film formation by the dry oxidation, Δ mark indicates the damage after the 4.5 nm-thick silicon oxide film formation by the low pressure wet oxidation. As shown, the damage incorporated by the fluorine ion implantation has been substantially removed during the formation of the silicon oxide film. Considering that the residual damage in the sample, which the silicon oxide film is formed after the nitrogen ion implantation at the dose of $5\times10^{14}$ cm$^{-2}$ dose, is typically about 2000 [TW unit], the enhanced oxidation by fluorine ion implantation is more effective than that by nitrogen ion implantation.

FIG. 7 is a graph of fluorine distributions in the silicon substrates before and after the silicon oxide films were formed. FIG. 8 is a graph of fluorine distributions in the silicon oxide films before and after the silicon oxide films were formed. As shown in FIG. 7, by either of the dry oxidation and the low pressure wet oxidation, fluorine concentrations in the silicon substrates are lowered to below the detection limit as the silicon oxide films were formed. On the other hand, as shown in FIG. 8, fluorine remains in the dry oxidation film by about 1/100 of the implanted doses, while fluorine remains in the low pressure wet oxidation film by about 1/1000 of the implanted doses. Accordingly, the low pressure wet oxidation film is less affected by fluorine in comparison with the dry oxidation film.

The mechanism for fluorine contributing to the enhanced oxidation in the wet oxidation process, and the mechanism for fluorine in the silicon oxide film vanishing are not clear. The inventors of the present invention consider as follows. That is, fluorine contributes to the enhanced oxidation in the wet oxidation process because fluorine atoms bonded with silicon atoms in the interface between the silicon oxide film and the silicon substrate attract electrons, thereby weakening bonds of back bonds of the silicon (FIG. 9A). The mechanism for fluorine in the silicon oxide film vanishing will be that OH$^-$ acts on bonding between the silicon and the fluorine in the silicon oxide film to bond the oxygen of the OH$^-$ with the silicon while the fluorine bonded with silicon is evaporated in HF (FIGS. 9B to 9D).

FIG. 10 is a graph of J-E characteristics of a sample with a silicon oxide film formed by the low pressure wet oxidation after fluorine ions were implanted at 5 keV acceleration energy and at a $5\times10^{14}$ cm$^{-2}$ dose, and J-E characteristics of a sample with a silicon oxide film formed by the low pressure wet oxidation without fluorine ion implantation. FIG. 11 is a graph of high frequency C-V characteristics of a sample with silicon oxide films formed by the low pressure wet oxidation after fluorine ions were implanted at 5 keV acceleration energy and a sample with a silicon oxide film formed by the low pressure wet oxidation without fluorine ion implantation. A MOS capacitor used in the measurement had an N$^+$ gate electrode formed on a p-type substrate interposing the silicon oxide film therebetween and had a 0.1 mm$^2$ electrode area. As shown in FIG. 10, the sample with fluorine ions implanted, and the sample without fluorine ions implanted have substantially equal J-E characteristics. As shown in FIG. 11, the sample with fluorine ions implanted in a $1\times10^{15}$ cm$^{-2}$ dose has the large flat band voltage shift, but the samples with fluorine ions implanted in doses of not more than $5\times10^{14}$ cm$^{-2}$ could have the flat band voltage shifts suppressed small. Thus, it is considered that the fluorine implantation in doses which are less than $1\times10^{15}$ cm$^{-2}$ does not affect the electric characteristics of the silicon oxide film.

As described above, silicon oxide film is formed by the low pressure wet oxidation after fluorine ions are implanted, whereby the silicon oxide film can have higher reliability than wet oxidation film formed without the fluorine ion implantation. In addition, the effect of the enhanced oxidation can be enhanced in comparison with that produced by the conventional method using argon ion implantation.

Iodine (I), which is a halogen element, as is fluorine, has the same properties as fluorine, and has the atomic weight, which is larger than that of fluorine. Iodine ions are used as a dopant to be implanted before the silicon oxide film is formed to produce the same effect described above as produced by implanting fluorine ions, and the enhanced oxidation is more effective than that produced by fluorine ion implantation.

FIG. 12 is a graph of film thickness differences of silicon oxide films of samples prepared by implanting iodine ions at 10–20 keV acceleration energy and in $0$–$1\times10^{15}$ cm$^{-2}$ doses through 6 nm-thick sacrificial oxidation films, removing the sacrificial oxidation films and forming the silicon oxide films by thermal oxidation.

AS shown, by the iodine ion implantation as well as the fluorine ion implantation, the film thicknesses of the silicon oxide films increase as the doses increase. The film thickness increases of the silicon oxide films are much larger in comparison with those by the fluorine ion implantation. At 10 keV acceleration energy, a film thickness increase was about 10% for a $1\times10^{13}$ cm$^{-2}$ dose; about 20–40% , for a $1\times10^{14}$ cm$^{-2}$ dose; about 50–80% for a $3\times10^{14}$ cm$^{-2}$ dose; about 60–120% for a $5\times10^{14}$ cm$^{-2}$ dose; and about 150–240% for a $1\times10^{15}$ cm$^{-2}$ dose. At 20 keV acceleration energy, a film thickness increase was about 30–60% for a $5\times10^{14}$ cm$^{-2}$ dose. The iodine ion implantation as well as the fluorine ion implantation makes the effect of the enhanced oxidation higher in the dry oxidation film than in the low pressure wet oxidation film. In comparison with the fluorine ion implantation, the iodine ion implantation can make the effect of the enhanced oxidation higher also in the low pressure wet oxidation film.

FIG. 13 is a graph of reliability of silicon oxide films of samples measured by constant voltage TDDB, each of which was formed by implanting iodine ions at 10 keV acceleration energy and forming a 5 nm-thick silicon oxide film by low pressure wet oxidation. In FIG. 13, □ mark indicates the reliability for the silicon oxide film formed at a $1\times10^{13}$ cm$^{-2}$ dose, Δ mark indicates the reliability for the silicon oxide film formed at a $1\times10^{14}$ cm$^{-2}$ dose. As a control, the reliability of a sample without iodine ions implanted is indicated by ○ mark. Oxidation conditions were controlled so that all the samples have a 5 nm-thickness for the end of expelling influences due to differences in the film thickness.

As shown, all the samples with iodine ions implanted could have the oxide film lifetimes equal to or longer than the oxide film lifetime of the sample without iodine ions implanted.

As described above, by the iodine ion implantation as well, the effect of the enhanced oxidation can be enhanced without deteriorating film quality of silicon oxide film. Especially by using iodine, a much higher rate of the enhanced oxidation can be obtained in comparison with that obtained by using fluorine. Accordingly, by using iodine, the atmospheric wet oxidation can provide sufficient effect of the enhanced oxidation.

Although the inventors of the present application have not tested, chlorine (Cl) and bromine (Br), which belong to VII group, are expected to produce the same effect.

A second method for fabricating a semiconductor device according to the present invention is characterized mainly in that ions of rare gas, such as xenon (Xe) or krypton (Kr) are implanted before the thermal oxidation for forming the gate insulation film.

Xenon and krypton as well as argon are elements belonging to the rare gas, and are elements having larger atomic weights than argon. Accordingly, it is considered that implanted xenon and krypton are little influential and have higher effect of the enhanced oxidation. From this viewpoint, the inventors of the present invention have made earnest studies and found that xenon ions and krypton ions are used as ion species to be implanted before a silicon oxide film is formed, whereby the effect of the enhanced oxidation can be much enhanced. Especially by using xenon good effect of the enhanced oxidation can be produced not only in the dry oxidation, but also in the low pressure wet oxidation and the atmospheric wet oxidation. By using even argon, which does not produce sufficient effect of the enhanced oxidation in the atmospheric wet oxidation, sufficient effect of the enhanced oxidation could be produced in the low pressure wet oxidation.

FIG. 14 is a graph of film thickness differences of silicon oxide films of samples with the silicon oxide films which were formed by implanting xenon ions at 10–20 keV acceleration energy and in 0–5×10$^{14}$ cm$^{-2}$ does through 6 nm-thick sacrificial oxidation films, removing the sacrificial oxidation films and forming the silicon oxide film by thermal oxidation. In FIG. 14, ○ mark indicates film thickness for the dry oxidation. □ mark indicates film thickness for the low pressure wet oxidation mark indicates film thickness for the low pressure wet oxidation following annealing at 600° C.

As shown, as the dose increases, the thickness of the silicon oxide films increases. At 10 keV acceleration energy, the film thickness increases by about 4–8% for a 1×10$^{13}$ cm$^{-2}$ dose, by about 10–20% for a 1×10$^{14}$ cm$^{-2}$ dose, by about 30–45% for a 3×10$^{14}$ cm$^{-2}$ dose, and by about 50–60% for a 5×10$^{14}$ cm$^{-2}$ dose. At 20 keV acceleration energy, the increases of the film thickness is a little smaller, and the increase of the film thickness is about 30–50% at a 5×10$^{14}$ cm$^{-2}$ dose.

In comparison between the dry oxidation and the low pressure wet oxidation, the film thickness increase is larger in the dry oxidation, as in the case of using halogen. In the low pressure wet oxidation, however, an about 50% film thickness at maximum could be obtained.

A characteristic of the use of xenon is that the effect of the enhanced oxidation can be produced even with the annealing after the ion implantation and before the oxidation. In the case of the argon ion implantation, the annealing makes the enhanced oxidation less effective. The annealing before the oxidation is effective to recover damage incorporated in a silicon substrate. Accordingly, the silicon oxide film after the annealing, and the silicon substrate can have improved reliability.

It is preferable that a film thickness of the sacrificial oxidation film, and acceleration energy for the ions are set to be the same as those for using halogen.

A third method for fabricating a semiconductor according to the present invention is characterized in that nitrogen ions are implanted before thermal oxidation for forming a gate insulation film, and then using oxidation combining the dry oxidation and the low pressure wet oxidation for forming the gate insulation film.

FIG. 15 is a graph of film thickness differences of silicon oxide films of samples with the silicon oxide films which were formed by implanting nitrogen ions (N$^+$) at 5 keV acceleration energy and in 0–4×10$^{14}$ cm$^{-2}$ does through 6 nm-thick sacrificial oxidation films, removing the sacrificial oxidation films and forming the silicon oxide film by the low pressure wet oxidation.

As shown, combining the nitrogen ion implantation and the low pressure wet oxidation, the effects of retarded oxidation can be obtained. However, the film thickness decrease is only about 7% for implanting nitrogen ions at 5 keV acceleration energy and in a 4×10$^{14}$ cm$^{-2}$ dose. In comparison with the dry oxidation which has the film thickness decrease of about 20%, the film thickness decrease in the low pressure wet oxidation is low.

From this viewpoint, the inventors of the present invention have made earnest studies to find the oxidation method which can obtain the effects of the retarded oxidation and the merit of the wet oxidation, and found for the first time that implanting nitrogen ions before forming the gate insulation film by the thermal oxidation and forming the gate insulation film by combining dry oxidation and low pressure wet oxidation is very effectively for producing the effect of the enhanced oxidation.

FIG. 16 is a graph of film thickness differences of silicon oxide films of samples with the silicon oxide films formed each by implanting nitrogen ions through a 6 nm-thick sacrificial oxidation film, removing the sacrificial oxidation film and forming the silicon oxide film by various oxidation methods. In FIG. 16, ○ mark indicates a 3 nm-thick silicon oxide film formed by the dry oxidation at 750° C. ● mark indicates a 3 nm-thick silicon oxide film formed by the dry oxidation after nitrogen annealing at 600° C. for 1 hour. □ mark indicates a 4 nm-thick silicon oxide film formed by the dry oxidation at 750° C. ■ mark indicates a 4 nm-thick silicon oxide film formed by the dry oxidation after nitrogen annealing at 600° C. for 1 hour. Δ mark indicates a 3 nm-thick silicon oxide film formed by the dry oxidation at 900° C. ▽ mark indicates a sample which is oxidized by the dry oxidation at 750° C. to form a 4 nm-thick silicon oxide film and processed for 30 minutes under a low pressure wet oxidation atmosphere. ▼ mark indicates a sample which is annealed at 1015° C. for 10 seconds in nitrogen atmosphere, oxidized by the dry oxidation at 750° C. to form a 4 nm-thick silicon oxidation film and processed for 30 minutes under a low pressure wet oxidation atmosphere.

As seen in FIG. 16, in forming a 4 nm-thick silicon oxide film by the dry oxidation at 750° C., the oxidation is retarded by about 20% (see the □ marks). The rate of the retarded oxidation can be enhanced to about 30% by the nitrogen annealing before the oxidation, at 600° C. for 1 hour (see the ■ marks).

In forming the 3 nm-thick silicon oxide film by the dry oxidation (see the ○ marks and ● marks), the retarded oxidation can be found, but the rate is lower than that for forming the 4 nm-thick silicon oxide film. This will be because the implanted nitrogen do not sufficiently contribute to the oxidation reaction in the oxidation for the 3 nm-thick silicon oxide film. Accordingly, in order to make the retarded oxidation sufficiently effective, it is effective to form silicon oxide film of an above 4 nm-thick.

In forming a silicon oxide film of an about 5.5 nm-total thickness by forming a 4 nm-thick silicon oxide film by the dry oxidation and then processing in a low pressure wet oxidation atmosphere for 30 minutes (see the ▽ marks), the retarded oxidation of about 30% is observed. Especially, under these conditions, the dry oxidation is followed by the wet oxidation, and reliability equal to the wet oxidation film can be obtained. However, when the nitrogen annealing is made at 1015° C. for 10 seconds before the dry oxidation, the effect of the retarded oxidation is not observed.

In comparing between $N^+$ ion implantation and $N_2^+$ ion implantation in the retarded oxidation effect, the retarded oxidation effect is higher in the former. This will be because $N_2^+$ has the larger atomic weight than $N^+$ and more damages the substrate with a result that the enhanced oxidation effect is exhibited. For nitrogen ion implantation for the purpose of the retarded oxidation the use of $N^+$ ions will be effective.

As described above, in order to form silicon oxide film of good quality by the retarded oxidation using nitrogen ions, it is effective to perform the oxidation combining the dry oxidation and the low pressure wet oxidation after nitrogen ions are implanted.

In a fourth method for fabricating a semiconductor device according to the present invention, in place of the ion implantation in the above-described first method for fabricating the semiconductor device, a semiconductor substrate with a sacrificial oxidation film formed on is exposed to a plasma atmosphere containing a halogen element to incorporate the halogen element in the semiconductor substrate.

The present method is the same as the methods using the ion implantation in that an element is incorporated for the purpose of enhancing the enhanced oxidation, and the effect produced by the present method is the same as that produced by the above-described first method for fabricating the semiconductor device.

As a method for incorporating a halogen element by using plasma, for example, a gas, as of $F_2$, ArF, KrF, XeF, $Cl_2$, ArCl, KrCl, XeCl, $Br_2$, ArBr, KrBr, XeBr, $I_2$, ArI, KrI, XeI, or others, is incorporated in a vacuum system for magnetron plasma processing.

For example, a halogen element can be incorporated in a silicon substrate by introducing one of these gases into a vacuum system, applying a substrate bias to the back side of the silicon substrate under a 0.01–10 Pa to establish a negative voltage within 1 kV, concurrently therewith introducing electromagnetic waves of 200–2000 W of rf (e.g. 13.56 MHz) or microwaves to parallel plate electrodes to cause discharges and expose the substrate to the plasma for about 10 seconds—about 3 minutes. In place of applying rf or microwaves, electron beams may be applied to ionize a halogen element to apply the halogen ions to the silicon substrate. An ion source, such as ECR, is used to apply ionized halogen ions to the silicon substrate.

A distribution of a halogen element in the silicon substrate can be controlled by gas partial pressure control, discharge voltage control, and a thickness of a protection film on the surface of a silicon substrate. By controlling these parameters, a concentration of the surface of the silicon substrate can be changed to about $1\times10^{19}$ $cm^{-2}$–$10^{22}$ $cm^{-2}$.

A halogen element is distributed, decreasing a concentration from the surface of the substrate toward the inside thereof. A distribution width is about 5–10 nm and is about 20–30 nm at maximum.

In exposing the silicon substrate to the plasma, it is important to cover the surface of the silicon substrate with a protection film, and an about 5–10 nm thick silicon oxide film, for example, is formed. In setting high a concentration of halogen to be incorporated, a material of the protection film may be changed corresponding to a gas to be used.

If necessary, a gas, such as a rare gas, may be added to the halogen gas to prepare a mixed gas.

The above-described object is achieved by a method for fabricating the semiconductor device comprising the steps of: selectively introducing a halogen element or argon into a first region of a silicon substrate; and wet oxidizing the silicon substrate in an ambient atmosphere which an H2O partial pressure is less than 1 atm to thereby form a first silicon oxide film in the first region of the silicon substrate, and a second silicon oxide film thinner than the first silicon oxide film in a second region of the silicon substrate different from the first region.

The above-described object is also achieved by a method for fabricating the semiconductor device comprising the steps of: selectively introducing iodine, krypton or xenon into a first region of a silicon substrate; and oxidizing the silicon substrate to thereby form a first silicon oxide film in the first region, and a second silicon oxide film thinner than the first silicon oxide film in a second region of the silicon substrate different from the first region.

The above-described object is also achieved by a method for fabricating the semiconductor device comprising the steps of: selectively introducing nitrogen into a first region of a silicon substrate; and wet oxidizing the silicon substrate after dry oxidation to thereby form a first silicon oxide film in the first region, and a second silicon oxide film thicker than the first silicon oxide film in a second region of the silicon substrate different from the first region.

The above-described object is also achieved by a method for fabricating the semiconductor device comprising the steps of: selectively introducing a halogen element or a rare gas at a first concentration into a first region of a silicon substrate; selectively introducing a halogen element or a rare gas at a second concentration higher than the first concentration into a second region of the silicon substrate different from the first region; and wet-oxidizing the silicon substrate to thereby form a first silicon oxide film in the first region, a second silicon oxide film thicker than the first silicon oxide film in the second region, and a third silicon oxide film thinner than the first silicon oxide film in a third region of the silicon substrate different from the first region and the second region.

The above-described object is also achieved by a method for fabricating the semiconductor device comprising the steps of: selectively introducing a halogen element or a rare gas into a first region of a silicon substrate; selectively introducing nitrogen in a second region of the silicon substrate different from the first region; and wet-oxidizing the silicon substrate after dry oxidation to thereby form a first silicon oxide film in the first region, a second silicon oxide film thinner than the first silicon oxide film in the second region, and a third silicon oxide film thinner than the first silicon oxide film and thicker than the second silicon oxide film in a third region of the silicon substrate different from the first region and the second region.

DETAILED DESCRIPTION OF THE INVENTION

A First Embodiment

A method for fabricating the semiconductor device according to a first embodiment of the present invention will be explained with reference to FIGS. 17A–17D and 18A–18C.

FIGS. 17A–17D and 18A–18C are sectional views of a semiconductor device in the steps of the method for fabricating the same according to the present embodiment, which show the method.

Figure 17A:
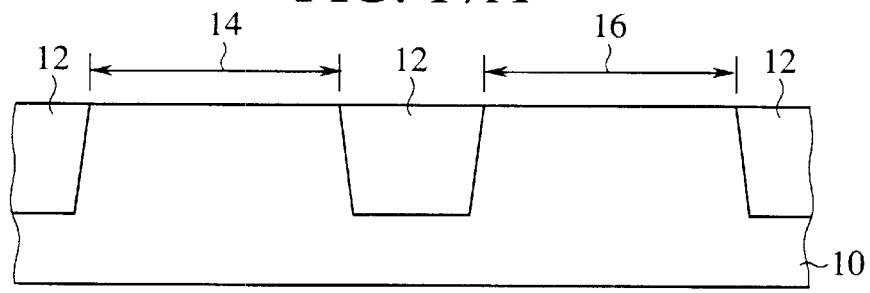
FIGS. 17A–17D and 18A–18C are sectional views of a semiconductor device in the steps of the method for fabricating the same according to a first embodiment of the present invention, which show the method.

A device isolation film 12 buried in a silicon substrate 10 is formed by, e.g., shallow trench technique. The device isolation film 12 defines a device region 14 and a device region 16 (FIG. 17A). In the present embodiment, the device region 14 is a region where a thick gate insulation film is to be formed, and the device region 16 is a region where a thin gate insulation film is formed. In a DRAM, for example, the device region 14 can be a memory cell region and the device region 16 can be a peripheral circuit region.

Figure 17B:
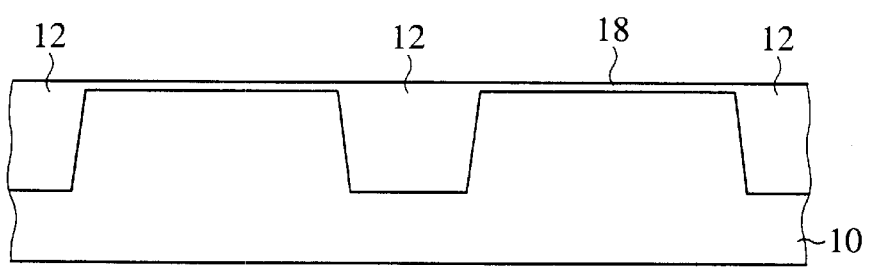

Then, a sacrificial oxidation film 18 is formed, by thermal oxidation, of, e.g., an about 6 nm-thick silicon oxide film on the device regions 14, 16 defined by the device isolation film 12 (FIG. 17B).

Next, a photoresist film 20 exposing the device region 14 and covering the device region 16 is formed by the usual photolithography techniques.

Figure 17C:
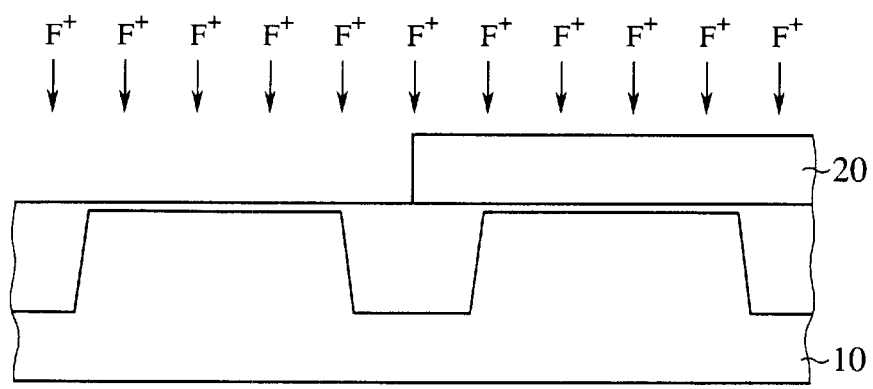

Then, fluorine ions are implanted in the silicon substrate 10 with the photoresist film 20 as a mask. The fluorine ions are implanted, e.g., at 5 keV acceleration energy and a $5 \times 10^{14}$ cm$^{-2}$ dose (FIG. 17C).

Next, after the photoresist film 20 is removed, the sacrificial oxidation film 18 is removed by wet etching using a hydrofluoric acid based aqueous solution. After the sacrificial oxidation film 18 is removed, chemical oxide film may be formed on the surface of the substrate 10 by processing using a chemical liquid, such as SC-1, SC-2 or others.

Figure 17D:
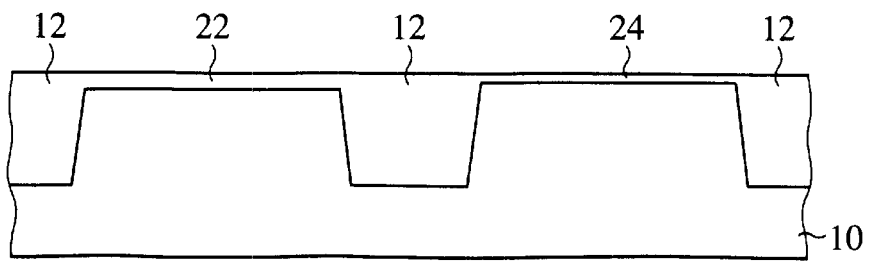

Then, the silicon substrate 10 is thermally oxidized by low pressure wet oxidation to form a gate insulation film 22 of silicon oxide film on the device region 14 and a gate insulation film 24 of silicon oxide film on the device region 16. At this time, the enhanced oxidation takes place in the device region 14, where fluorine ions have been incorporated in. Accordingly, the gate insulation film 22 is formed thick in the device region 14, and in the device region 16, the gate insulation film 24 is formed thin (FIG. 17D). For example, when the thermal oxidation is performed at a 750° C. oxidation temperature, under a 40 Torr film forming chamber pressure, at a 3 liters hydrogen flow rate, a 3 liters oxygen flow rate, a 20 liters nitrogen flow rate and a 5% hydrochloric acid flow rate, and with a target film thickness of the silicon substrate without fluorine ions implanted set at 4.5 nm, the gate insulation film 22 in the device region 14 is formed of the silicon oxide film of about 5.1 nm-thick, and the gate insulation film 24 in the device region 16 is formed of the silicon oxide film of about 4.5 nm-thick. Thus, wet oxidation film of good quality can be formed while the effect of the enhanced oxidation owing to the ion implantation being exhibited.

Next, annealing is performed at 900° C. for 30 minutes to incorporate the nitrogen into the interface between the gate insulation films 22, 24 and the silicon substrate 10, whereby the gate insulation films 22, 24 are formed of silicon oxynitride film. An annealing temperature may be a temperature suitable to incorporate the nitrogen into the interface and can be typically 700–1100° C.

It is preferable from the viewpoint of improving reliability of the gate insulation films to form the gate insulation films of the silicon oxynitride film. Because fluorine enhances diffusion of boron, the gate insulation films 22, 24 are formed of silicon oxynitride film, whereby the effect of suppressing increase of gate resistance and source/drain resistance of P-type transistors can be produced. In the method for fabricating the semiconductor device according to the present embodiment, wherein fluorine ions are implanted for the purpose of the enhanced oxidation, it is preferable from the viewpoint of suppressing diffusion of boron to form the gate insulation films 22, 24 of silicon oxynitride film.

Gate electrodes 26 are formed on the gate insulation films 22, 24. Polycrystalline silicon film and tungsten silicide film are deposited by, e.g., CVD method and then are patterned by the usual photolithography and etching to form the gate electrodes 26 of the polycide structure of the layer film of the polycrystalline silicon film and the tungsten silicide film.

Figure 18A:
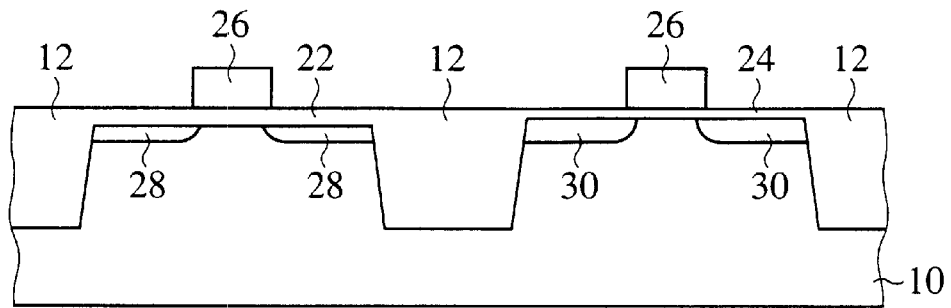

Next, ions are implanted in the device regions 14, 16 with the gate electrodes 26 as a mask to form a source/drain diffused layer 28 for memory cell transistors in the device region 14 and an extension region 30 of the source/drain diffused layer for peripheral circuit transistors in the device region 16 (FIG. 18A). For example, in the n-type transistor forming region, arsenic (As) ions are implanted at 10 keV acceleration energy and a $5\times10^{14}$ cm$^{-2}$, and, in the p-type transistor forming region, BF$_2$ ions are implanted at 10 keV acceleration energy $5\times10^{14}$ cm$^{-2}$.

Figure 18B:
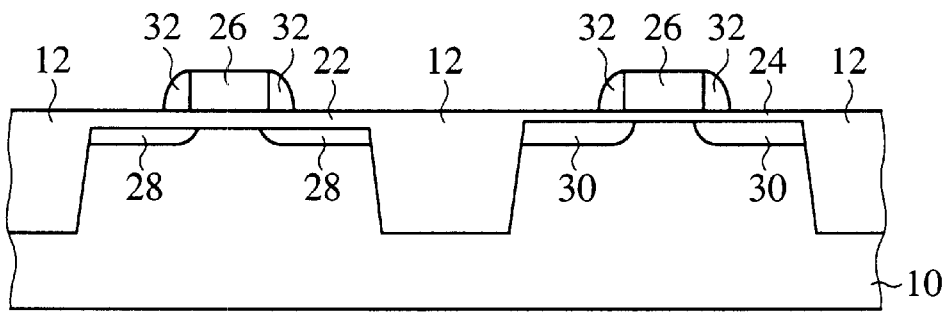

Next, silicon oxide film is deposited on the entire surface by, e.g., CVD method, and then etched back to form a sidewall insulation film 32 on the side walls of the gate electrodes 26 (FIG. 18B).

Then, ions are implantation in the device region 16 with the gate electrodes 26 and the sidewall insulation film 32 as a mask to form the source/drain diffused layer 34 for the peripheral circuit transistors. For example, in the n-type transistor forming region, arsenic ions are implanted at 50 keV acceleration energy and $3\times10^{15}$ cm$^{-2}$ dose, and in the p-type transistor forming region, BF$_2$ ions are implanted at 40 keV acceleration energy and $3\times10^{15}$ cm$^{-2}$ dose.

Figure 18C:
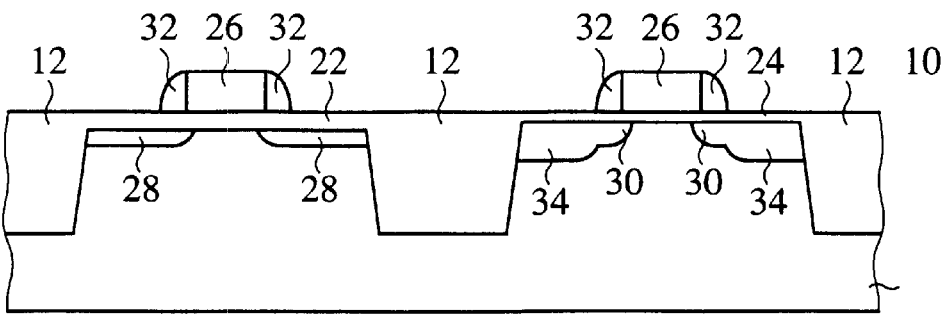

Thus, the memory cell transistors having the thin gate insulation film 22 are formed in the device region 14, and the peripheral circuit transistors having the thick gate insulation film are formed in the device region 16 (FIG. 18C).

As described above, according to the present embodiment, the thermal oxidation for forming the gate insulation films is made after fluorine ions have been selectively implanted, whereby the gate insulation film in the region where the fluorine ions have been implanted can be made selectively thicker. The gate insulation films are formed by the wet oxidation, whereby the gate insulation films can have improved reliability than those formed by the dry oxidation.

In the present embodiment, an ion species for enhancing the oxidation is fluorine ions, but in place of fluorine ions, halogen ions, such as iodine ions, or xenon ions may be used.

Figure 1:
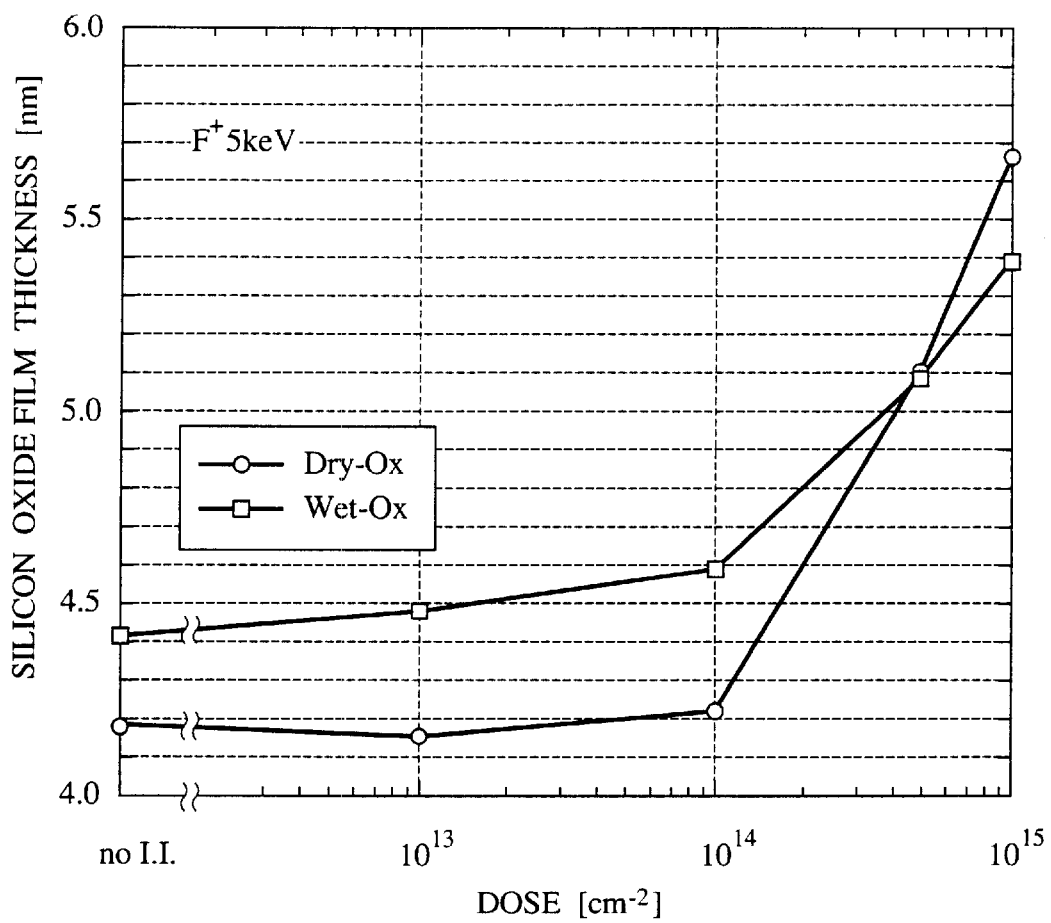
FIG. 1 is a graph of relationships between doses of fluorine ions and enhanced oxidation film thickness.
Figure 2:
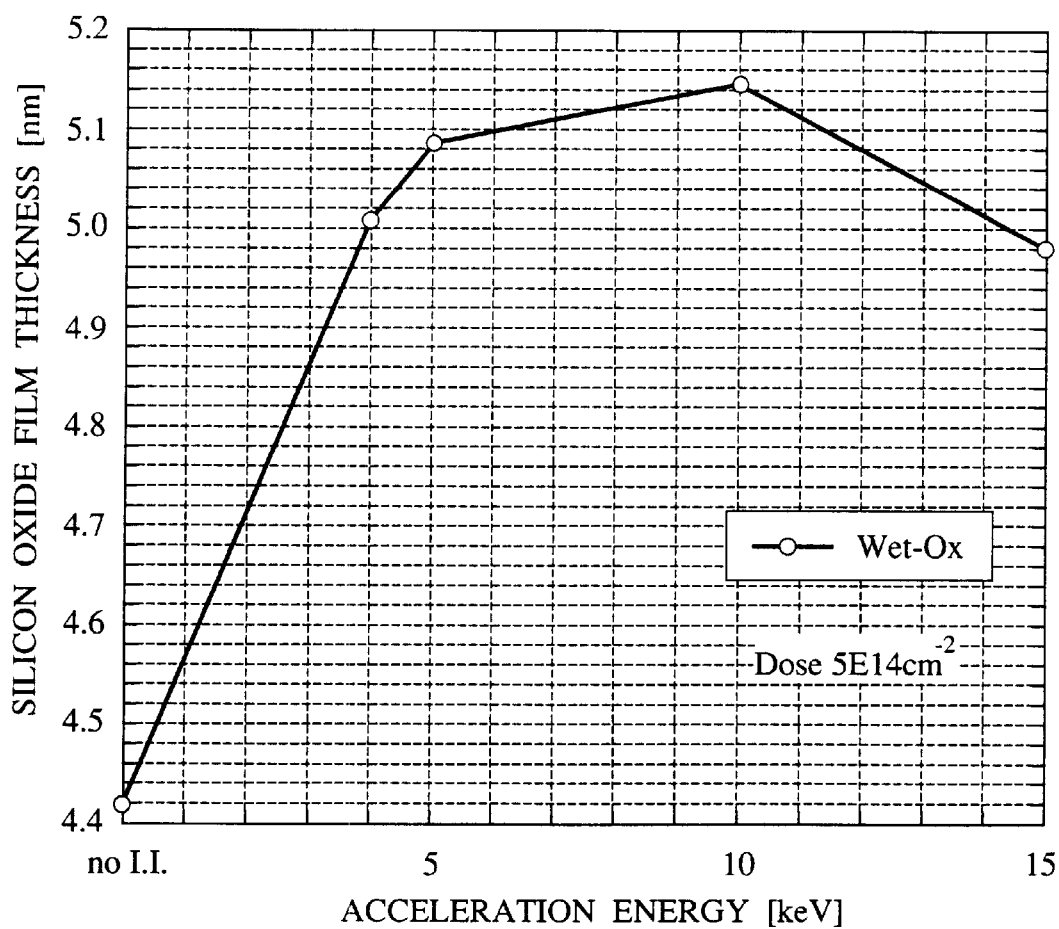
FIG. 2 is a graph of relationship between acceleration energy of fluorine ions and enhanced oxidation film thickness.
Figure 3:
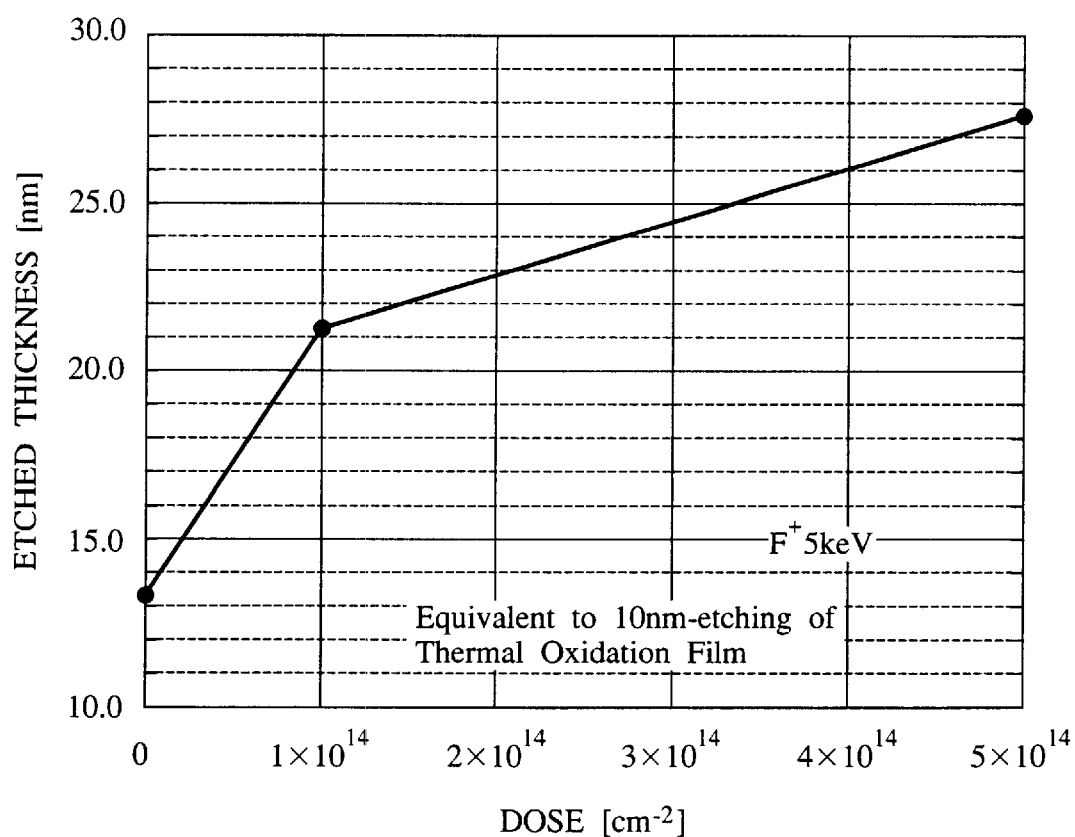
FIG. 3 is a graph of dose dependency of etching rates of silicon oxide film with nitrogen ions implanted.
Figure 4:
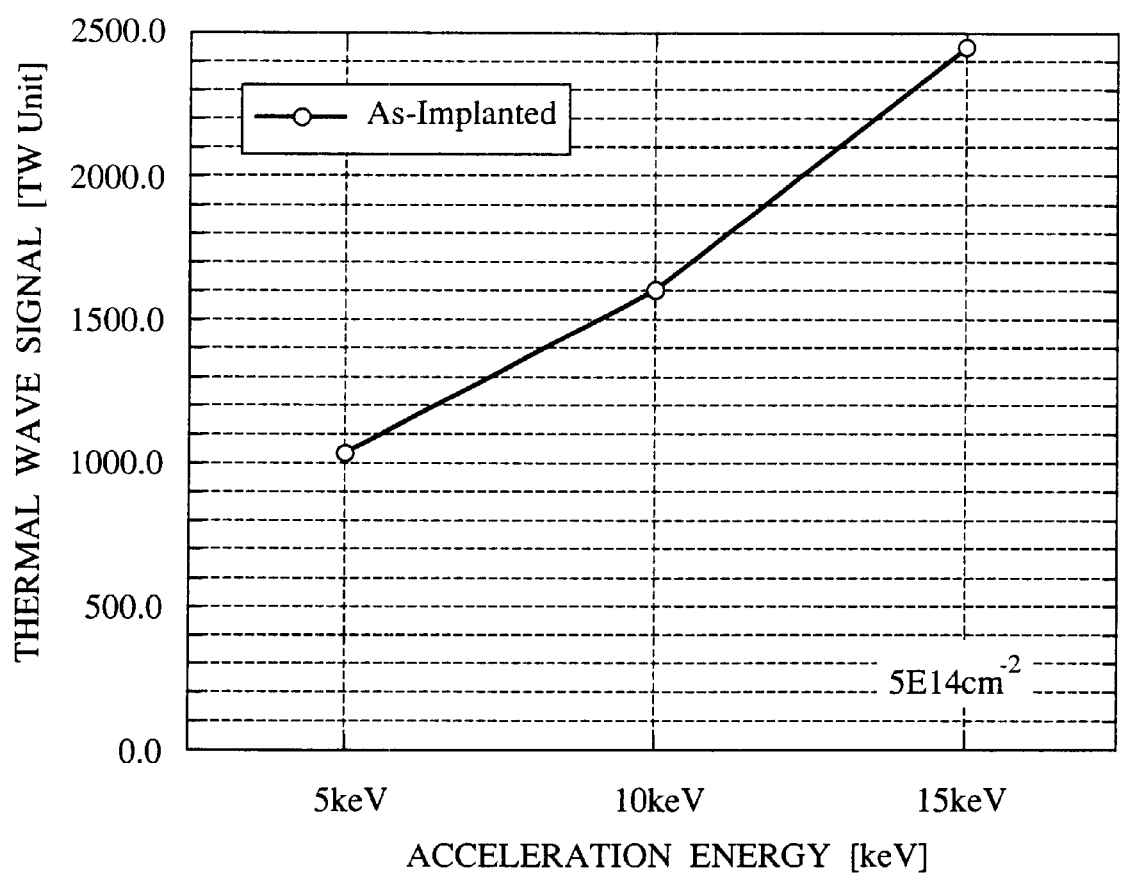
FIG. 4 is a graph of relationships between acceleration energy of fluorine ions and damage incorporated in the silicon substrate.
Figure 5:
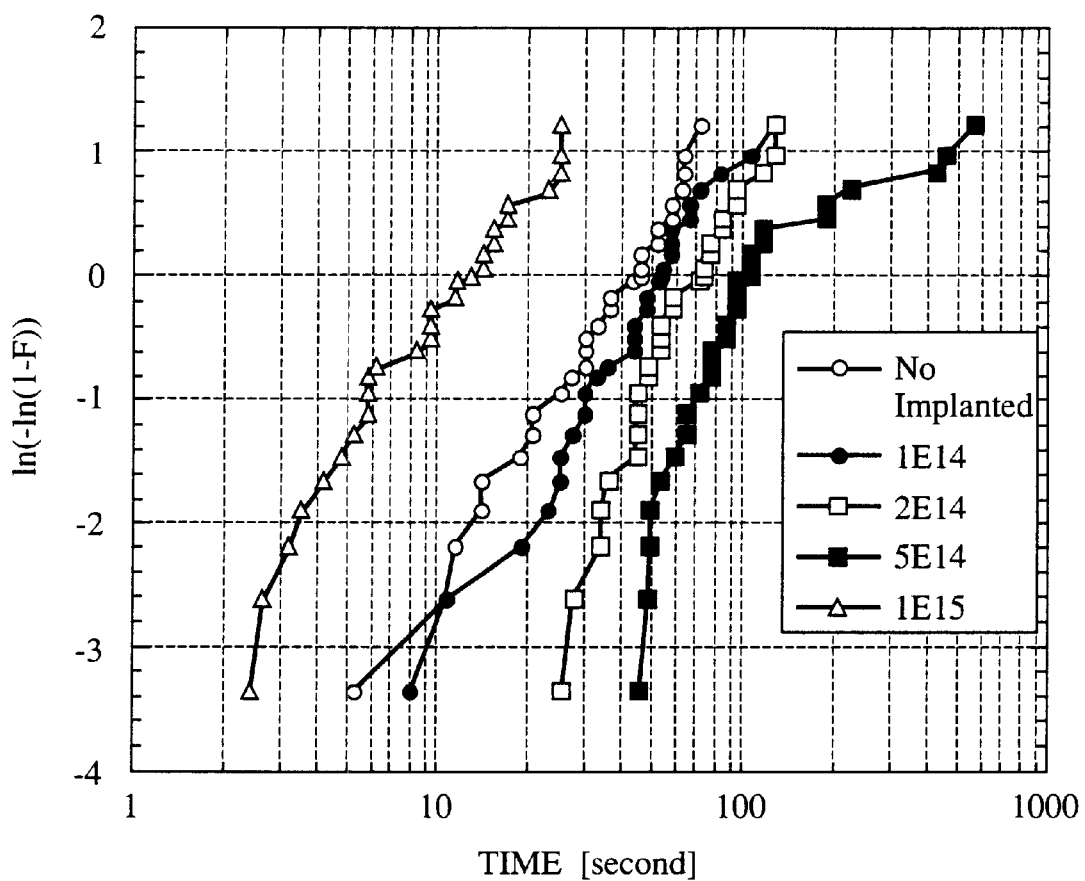
FIG. 5 is a graph of relationship between doses of fluorine ions and the silicon oxide film reliability.
Figure 6:
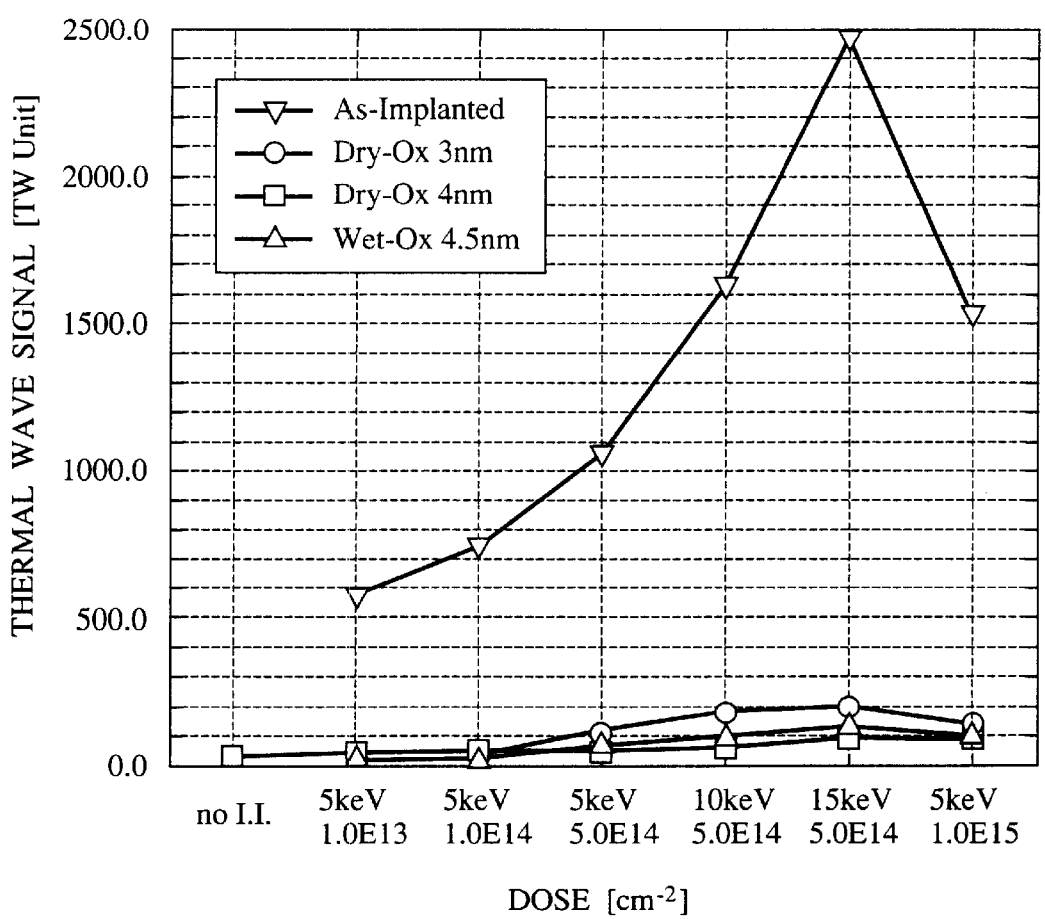
FIG. 6 is a graph of relationship between doses of fluorine ions and damage in the silicon substrates before and after silicon oxide films were formed.
Figure 7:
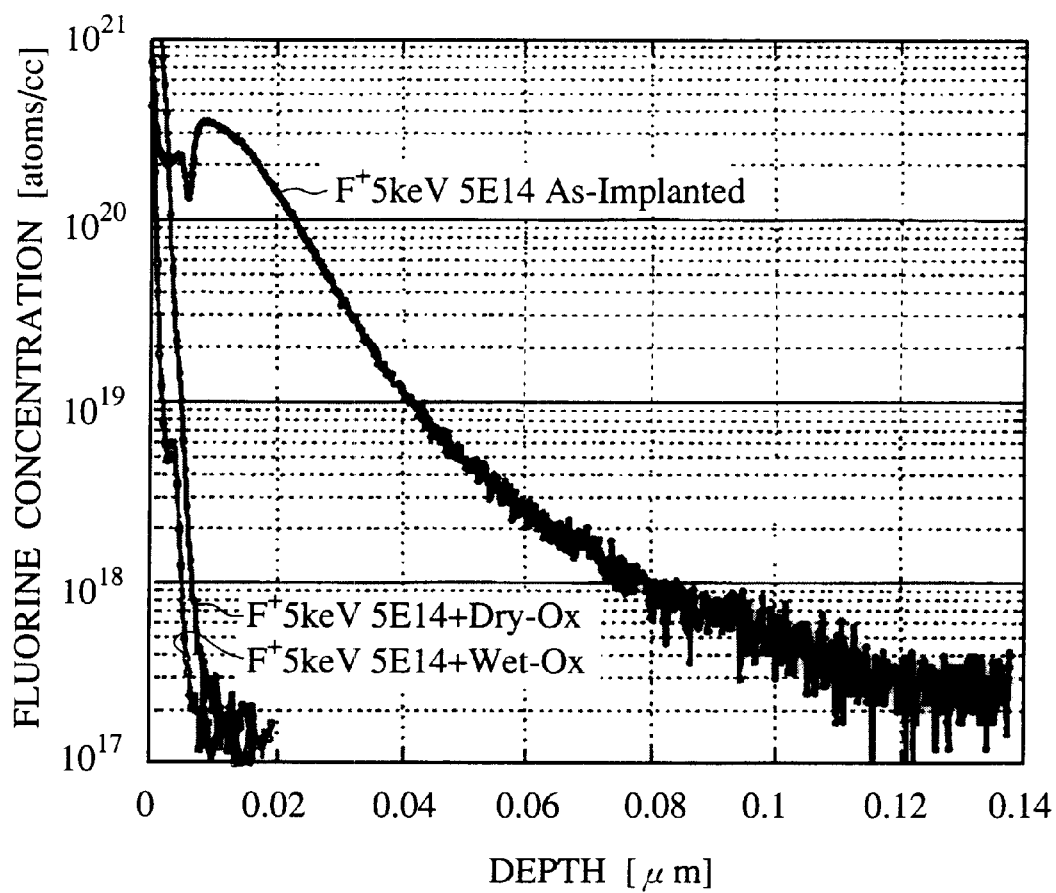
FIG. 7 is a graph of fluorine distributions in the silicon substrates before and after the silicon oxide films were formed.
Figure 8:
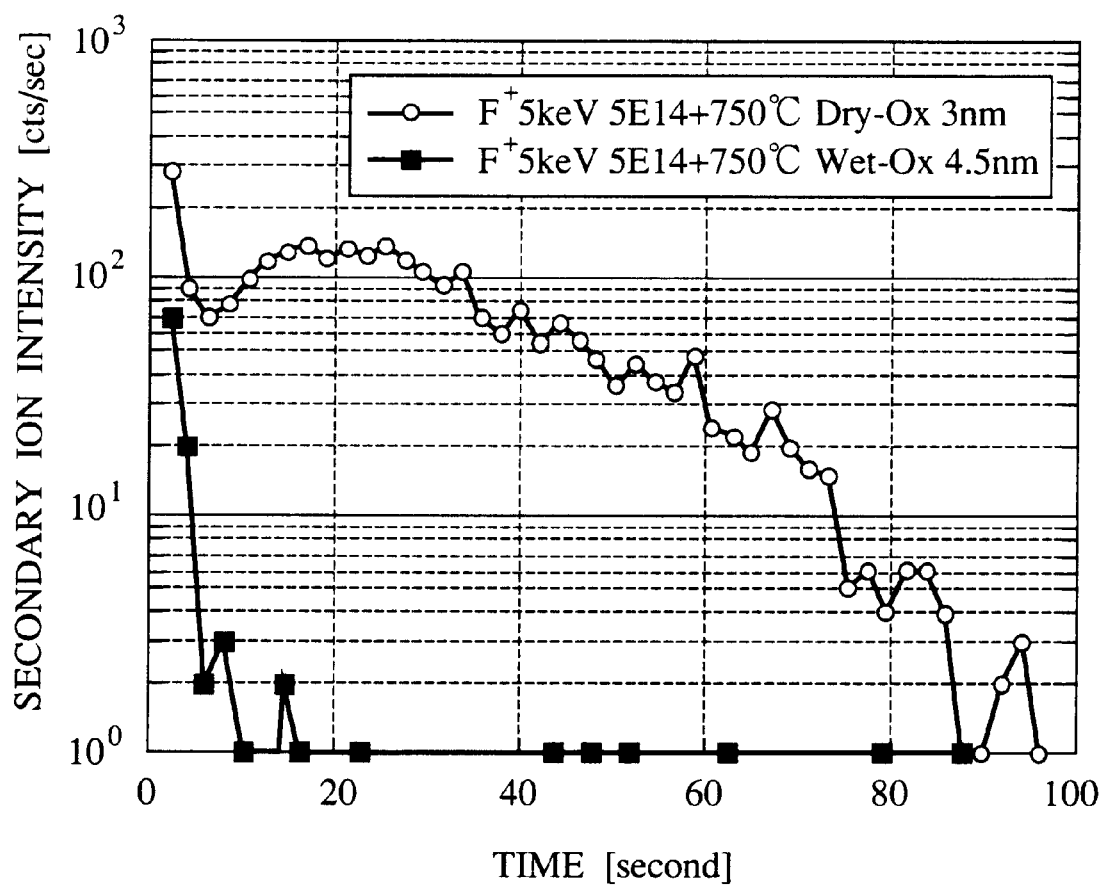
FIG. 8 is a graph of fluorine distributions in the silicon oxide films after the silicon oxide films were formed.
Figure 9A:
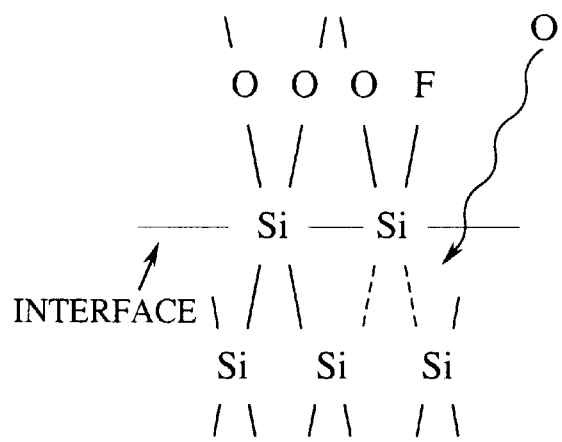
FIGS. 9A–9D are views showing the mechanism for fluorine contributing to the enhanced oxidation in the wet oxidation process, and the mechanism for fluorine in the silicon oxide film vanishing.
Figure 9B:
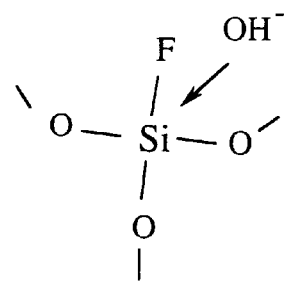
Figure 9C:
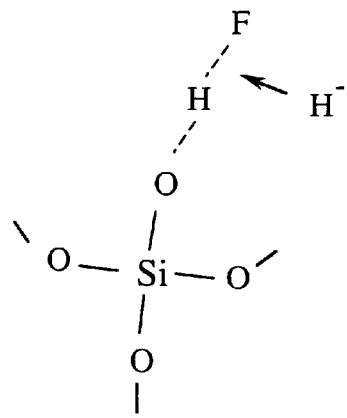
Figure 9D:
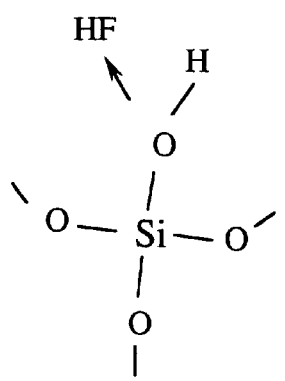
Figure 10:
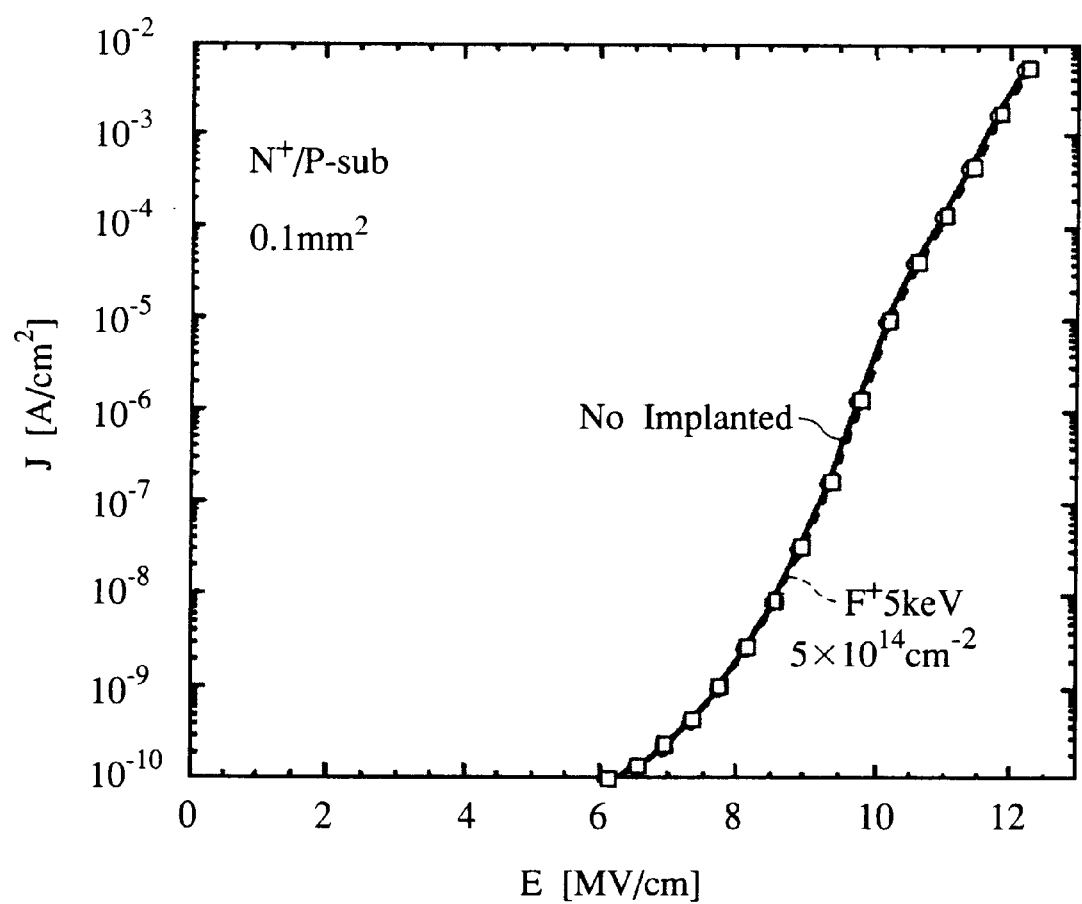
FIG. 10 is a graph of J-E characteristics of silicon oxide films formed after fluorine ion implantation.
Figure 11:
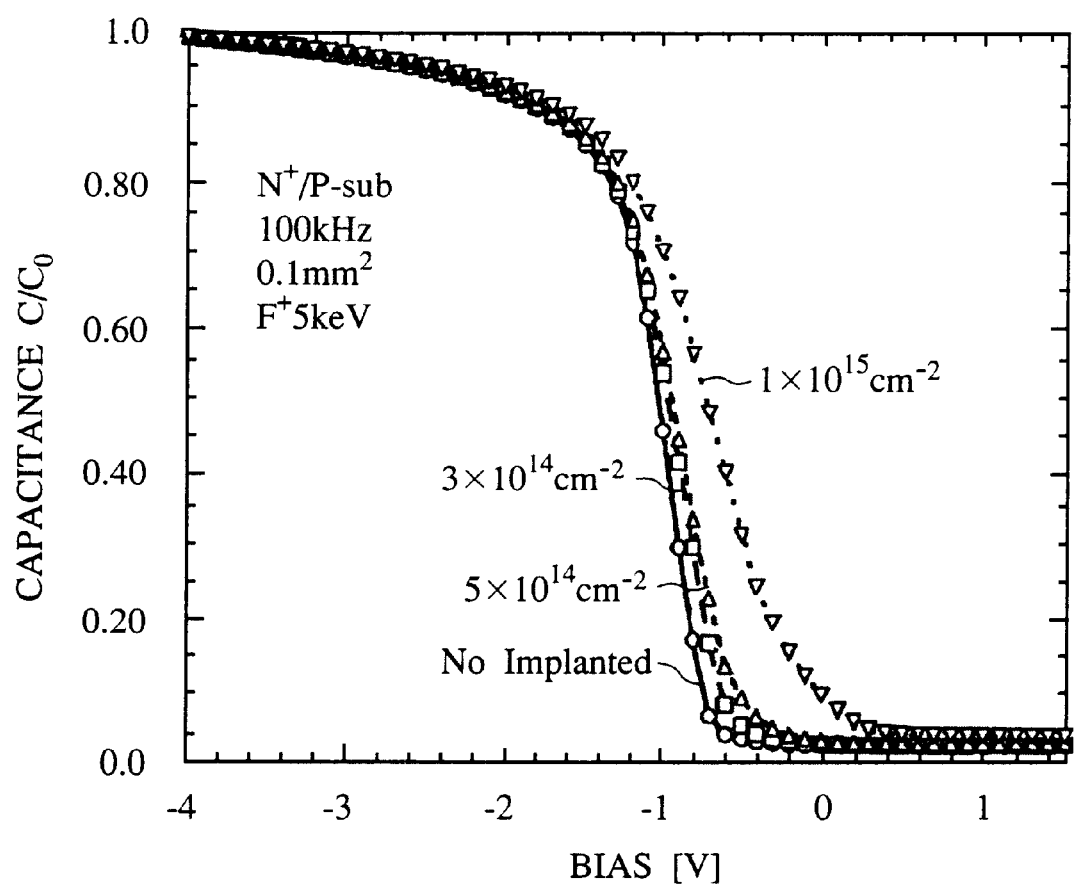
FIG. 11 is a graph of high frequency C-V characteristics of silicon oxide films formed after fluorine ion implantation.
Figure 12:
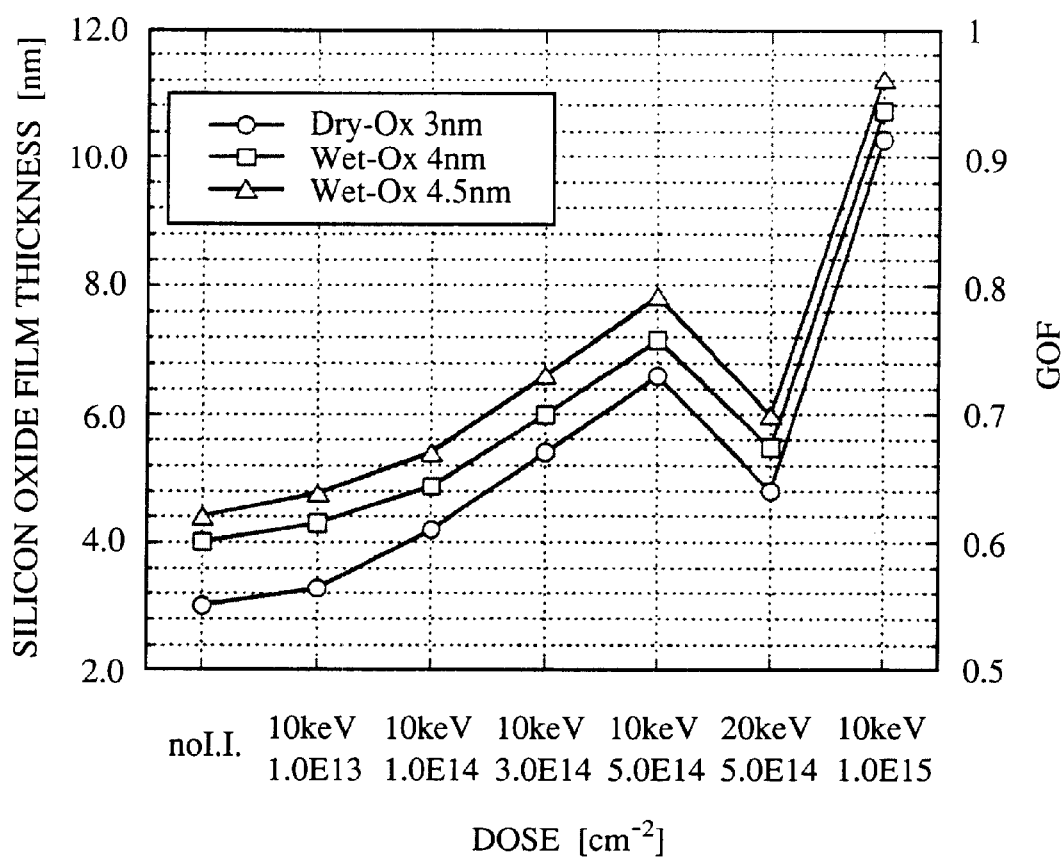
FIG. 12 is a graph of relationships between iodine ion doses and acceleration energy, and enhanced oxidation film thickness.
Figure 13:
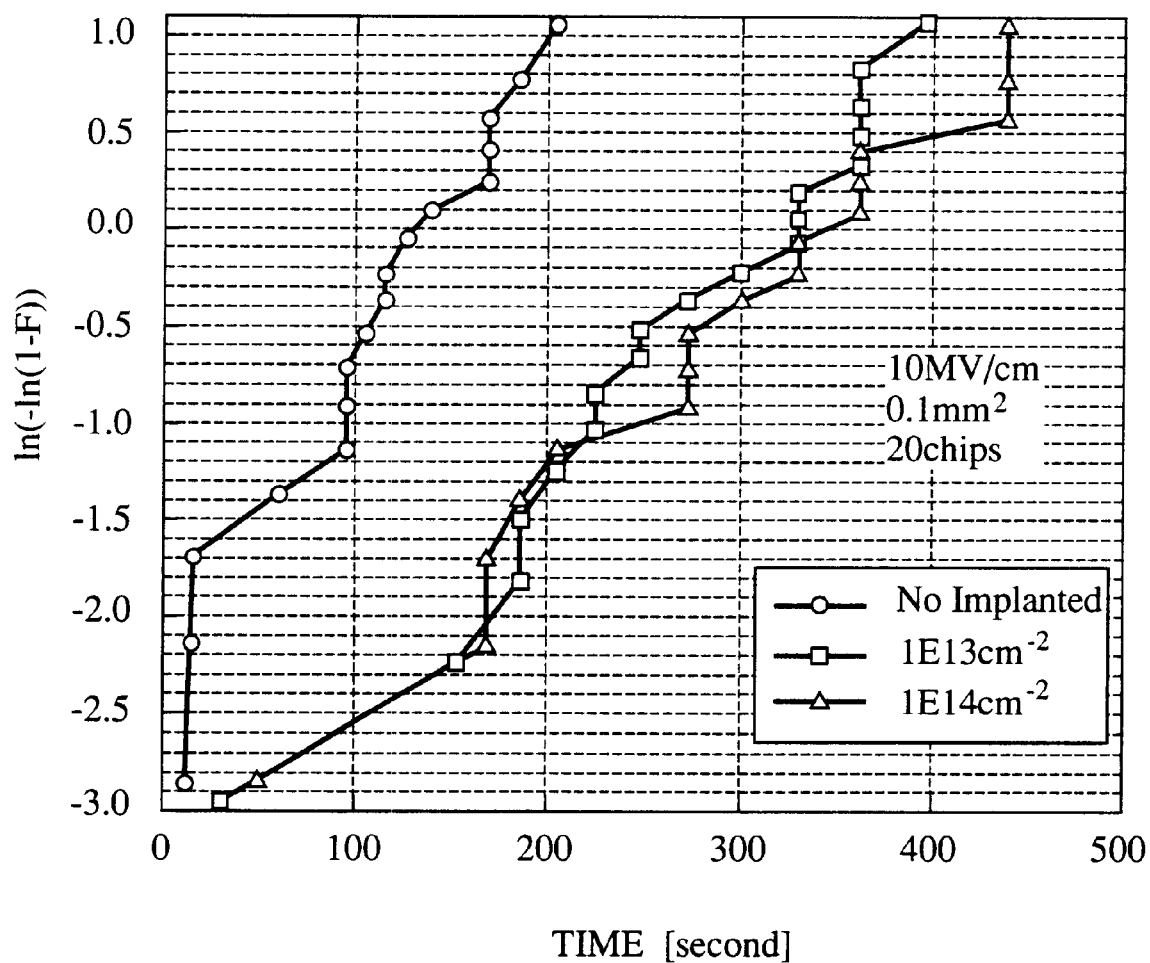
FIG. 13 is a graph of relationships between iodine ion doses and the silicon oxide film reliability.

Iodine ions are implanted, e.g., at 10 keV acceleration energy and $5\times10^{14}$ cm$^{-2}$ dose to form the gate insulation film 22 of an about 7.8 nm-thick silicon oxide film in the device region 14 and the gate insulation film 24 of an about 4.5 nm-thick silicon oxide film in the device region 16 (see FIG. 12).

Figure 14:
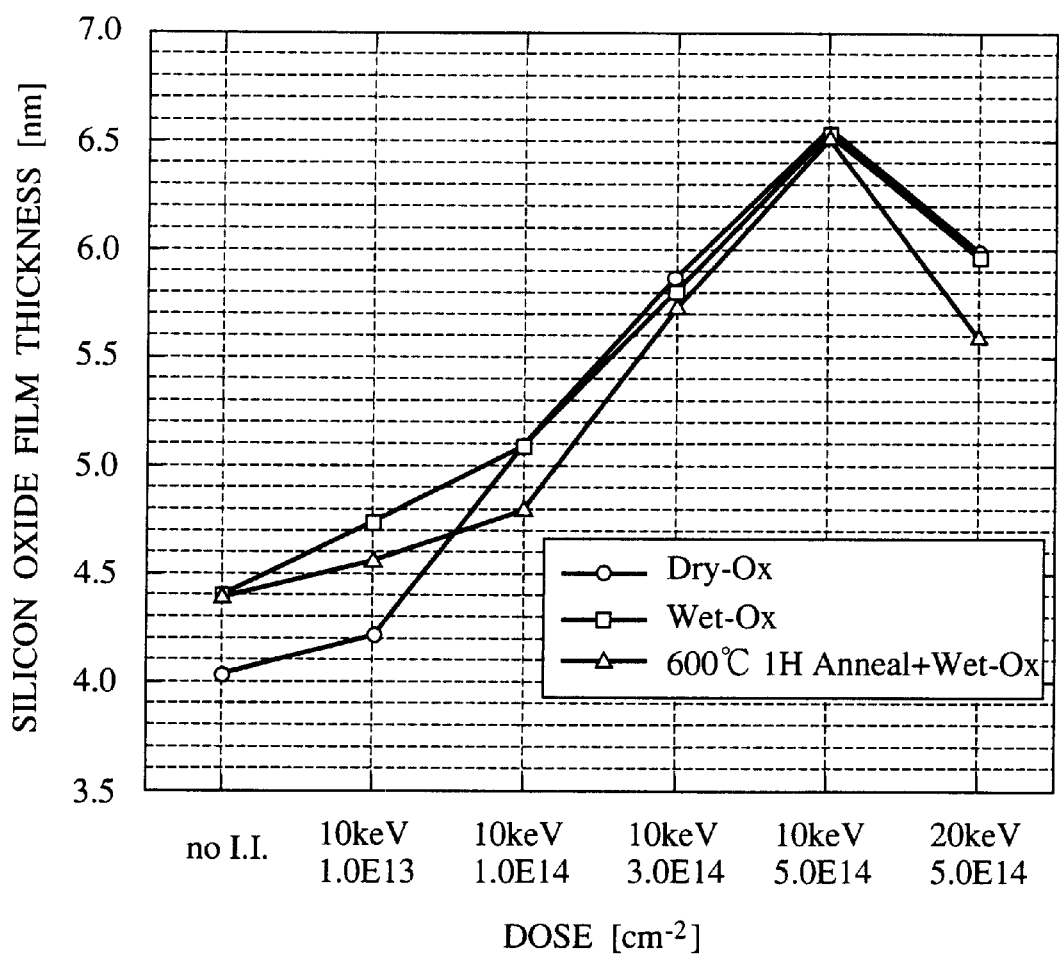
FIG. 14 is a graph of relationships between xenon ion doses and acceleration energy, and enhanced oxidation film thickness.
Figure 15:
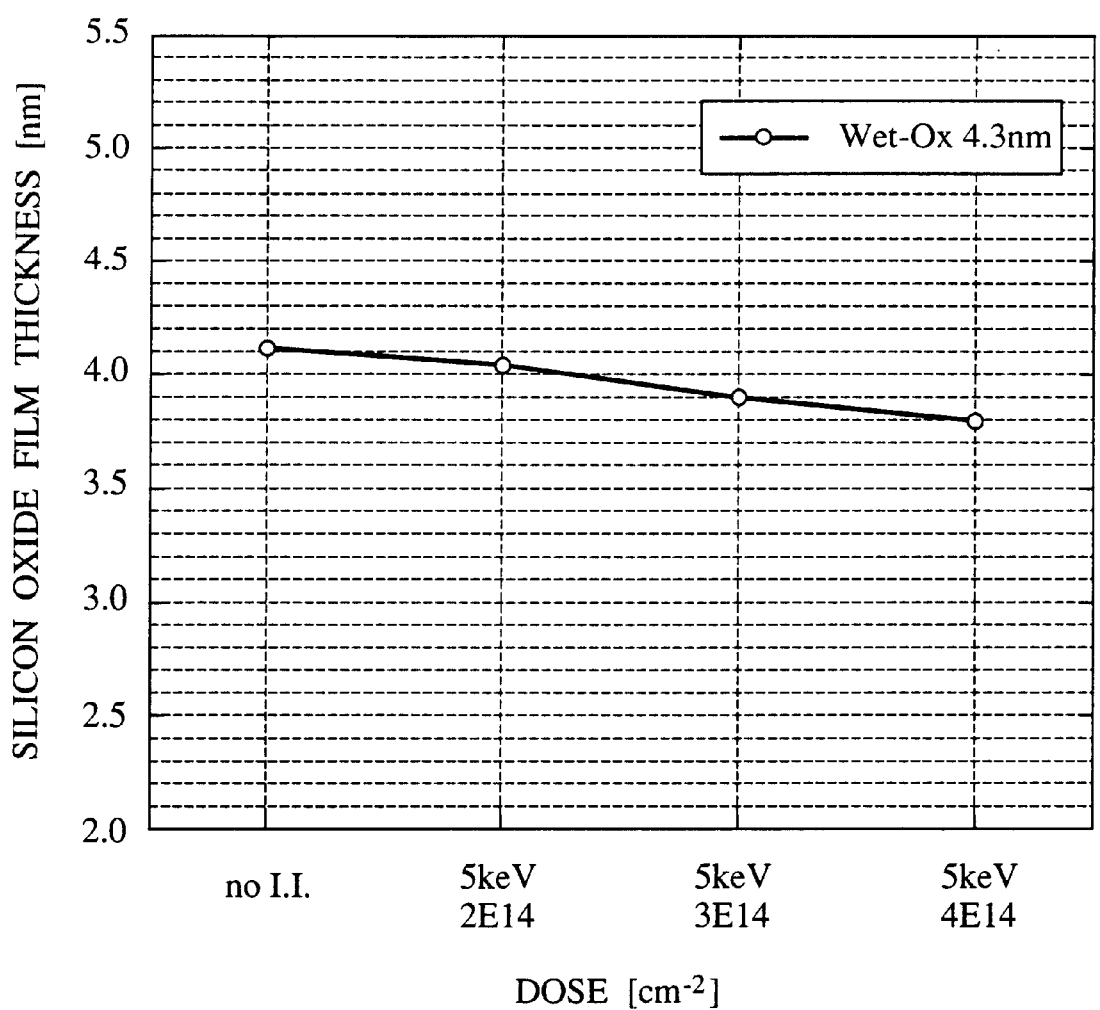
FIG. 15 is a graph of relationships between nitrogen ion doses and retarded oxidation film thickness.
Figure 16:
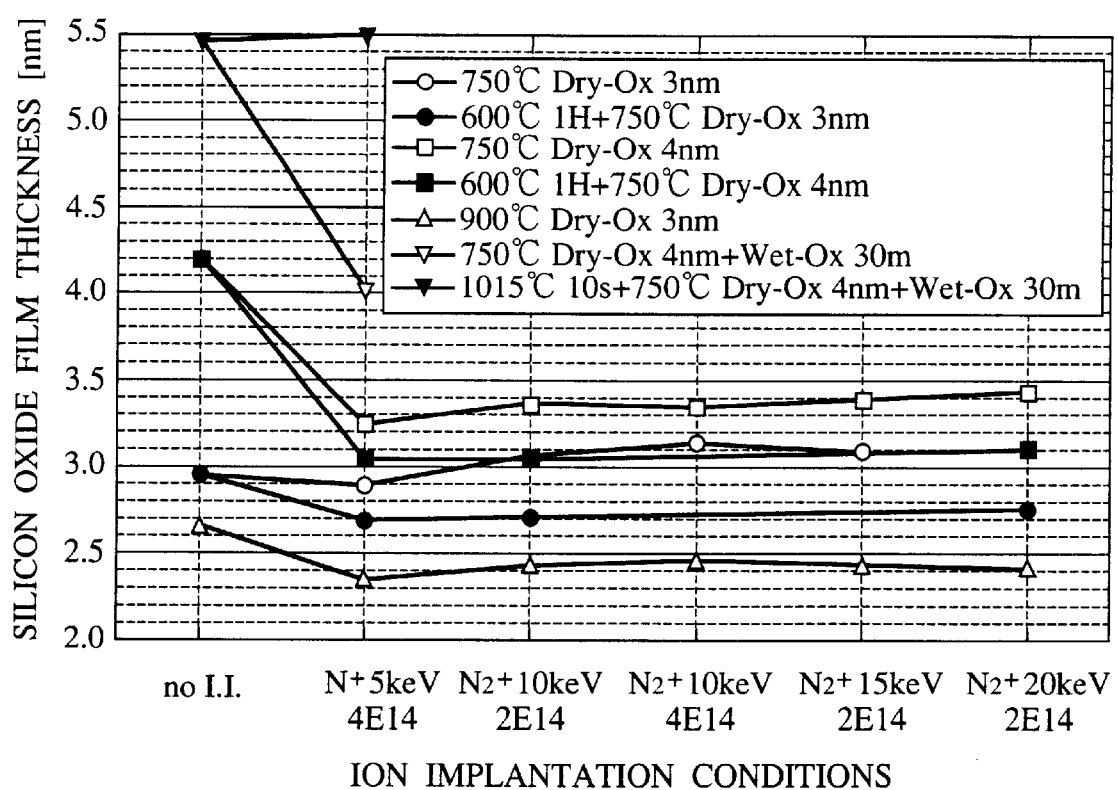
FIG. 16 is a graph of oxidation method dependency of retarded oxidation film thickness formed by thermal oxidation following nitrogen ion implantation.

Xenon ions are implanted, e.g., at 10 keV acceleration energy and $5\times10^{14}$ cm$^{-2}$ dose to form the gate insulation film 22 of an about 6.5 nm-thick silicon oxide film in the device region 14 and the gate insulation film 24 of an about 4.5 nm-thick silicon oxide film in the device region 16 (see FIG. 14). In the case that xenon ion are used, annealing of, e.g., 600° C. for 1 hour may be performed before the oxidation.

Fluorine ions may be implanted together with other ions, such as iodine ions, xenon ions, krypton (Kr) ions, argon ions, germanium (Ge) ions, silicon ions, etc., whereby the effect of the enhanced oxidation can be further enhanced. Fluorine, which has the effect of improving reliability of the insulation films, is implanted together with such ions to thereby more improve damage in the substrate than singly implanted.

A Second Embodiment

The method for fabricating the semiconductor device according to a second embodiment of the present invention will be explained with reference to FIGS. 19A–19C and 20A–20C. The same members of the present embodiment as those of the method for fabricating the semiconductor device according to the first embodiment are represented by the same reference numbers not to repeat or simplify their explanation.

FIGS. 19A–19C and 20A–20C are sectional views of a semiconductor device in the steps of the method for fabricating the same according to the second embodiment of the present invention, which show the method.

Figure 19A:
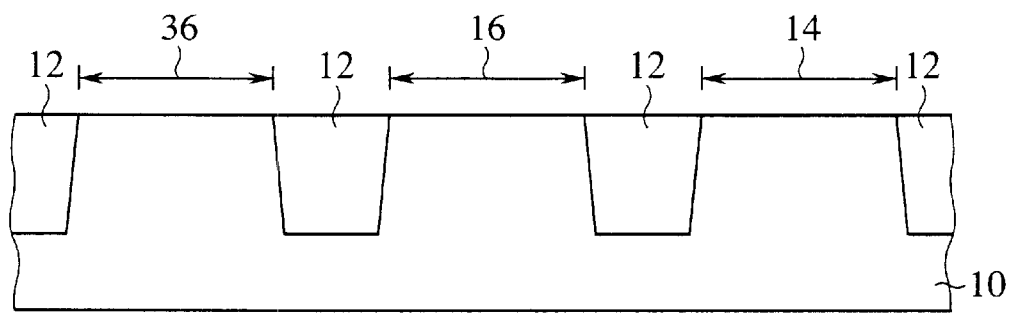
FIGS. 19A–19C and 20A–20C are sectional views of a semiconductor device in the steps of the method for fabricating the same according to a second embodiment of the present invention, which show the method.

A device isolation film 12 buried in a silicon substrate 10 is formed by, e.g., shallow trench technique. The device isolation film 12 defines a device region 36, a device region 14 and a device region 16 (FIG. 19A). In the present embodiment, the device region 14 is a region where a thick gate insulation film is to be formed, the device region 16 is a region where a thin gate insulation film is to be formed, and the device region 36 is a region where a gate insulation film thinner than the gate insulation film in the device region 14 but thicker than the gate insulation film in the device region 16 is to be formed. In a DRAM, for example, the device region 14 can a memory cell region, the device region 16 can be a peripheral circuit region, and the device region 36 can be a region for high breakdown voltage transistors, such as input/output transistors, etc. to be formed in.

Figure 19B:
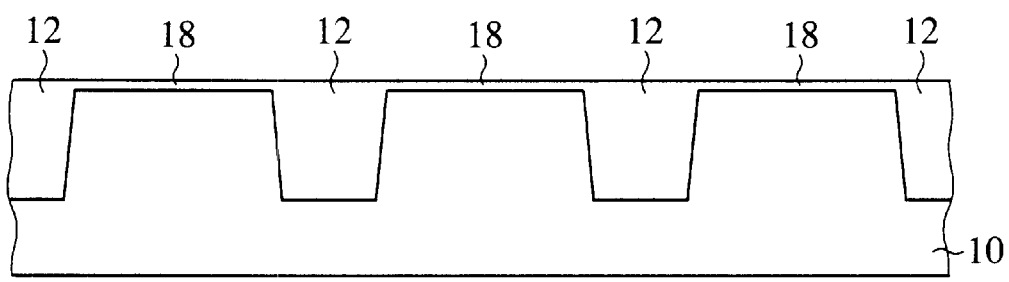

Then, a sacrificial oxidation film 18 is formed, by thermal oxidation, of, e.g., an about 6 nm-thick silicon oxide film on the device regions 14, 16, 36 defined by the device isolation film 12 (FIG. 19B)

Next, a photoresist film 38 exposing the device region 36 and covering the device regions 14, 16 is formed by the usual photolithography.

Figure 19C:
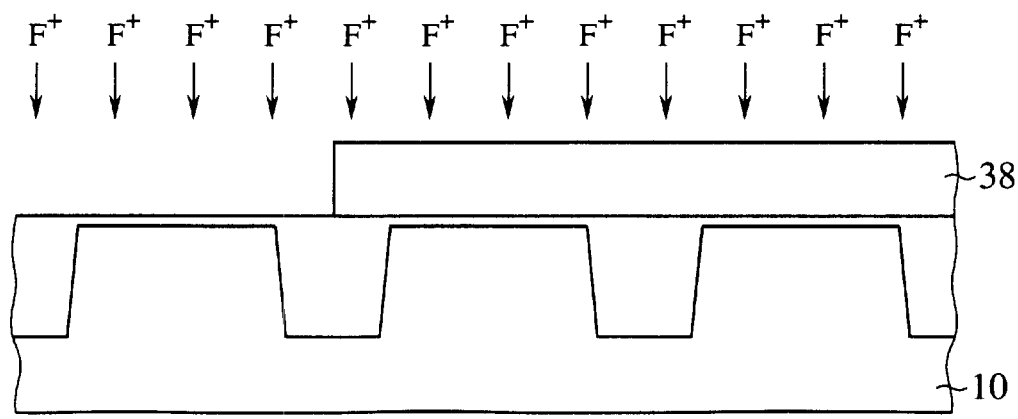

Then, fluorine ions are implanted in the silicon substrate 10 with the photoresist film 38 as a mask. The fluorine ions are implanted, e.g., at 5 keV acceleration energy and a $4\times10^{14}$ cm$^{-2}$ dose (FIG. 19C).

Next, after the photoresist film 38 is removed, a photoresist film 40 exposing the device regions 36, 14 and covering the device region 16 is formed by the usual photolithography.

Figure 20A:
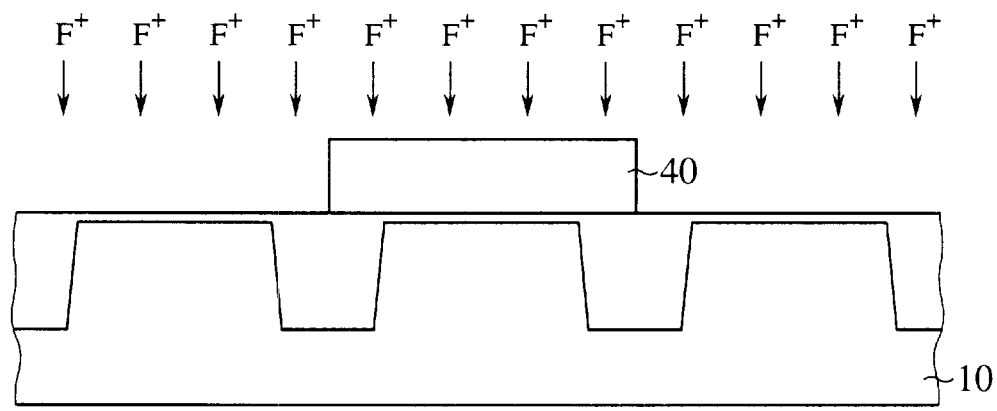

Then, with the photoresist film 40 as a mask, fluorine ions are implanted in the silicon substrate 10. Fluorine ions are implanted, e.g., at 5 keV acceleration energy and a $1\times10^{14}$ cm$^{-2}$ dose (FIG. 20A).

The twice ion implantation incorporates a $5\times10^{14}$ cm$^{-2}$ dose of fluorine in the device region 36 and a $1\times10^{14}$ cm$^{-2}$ dose of fluorine in the device region 14.

Next, the photoresist film 40 is removed, and then the sacrificial oxidation film 18 is removed by wet etching using a hydrofluoric acid based aqueous solution.

Figure 20B:
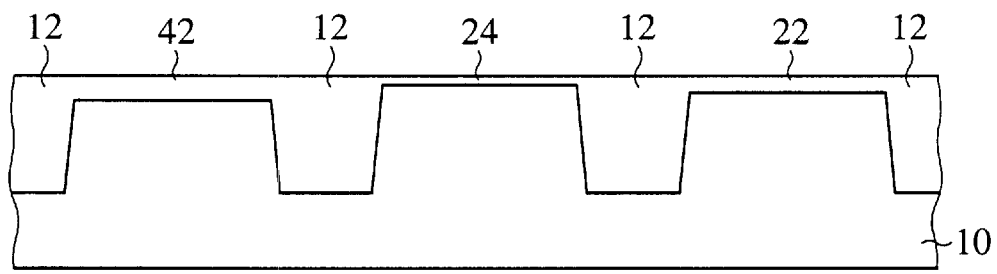

Then, the silicon substrate 10 is thermally oxidized by low pressure wet oxidation to form a gate insulation film 22 of silicon oxide film on the device region 14, a gate insulation film 24 of the silicon oxide film on the device region 16, and a gate insulation film 42 of the silicon oxide film on the device region 36. At this time, the enhanced oxidation takes place in the device regions 36, 14, where fluorine ions have been incorporated in. The enhanced oxidation is more enhanced in the device region 36, where more fluorine ions are incorporated than in the device region 14. Accordingly, the thick gate insulation film 42 is formed in the device region 36, the thin gate insulation film 24 is formed in the device region 16, and the gate insulation film 22 having the thickness thinner than the gate insulation film 42 but thicker than the gate insulation film 24 is formed in the device region 14 (FIG. 20B). For example, when the thermal oxidation is performed at a 750° C. oxidation temperature, under a 40 Torr film forming chamber pressure, at a 3 liters hydrogen flow rate, a 3 liters oxygen flow rate, a 20 liters nitrogen flow rate and a 5% hydrochloric acid flow rate, and with a target film thickness of the silicon substrate without fluorine ions implanted set at 4.5 nm, the gate insulation film 42 in the device region 36 is formed of the silicon oxide film of about 5.1 nm-thick, the gate insulation film 24 in the device region 16 is formed of the silicon oxide film of about 4.5 nm-thick, and the gate insulation film 22 in the device region 14 is formed of the silicon oxide film of about 4.7 nm-thick. Thus, wet oxidation film of good quality can be formed while the effect of the enhanced oxidation owing to the ion implantation being exhibited.

Figure 20C:
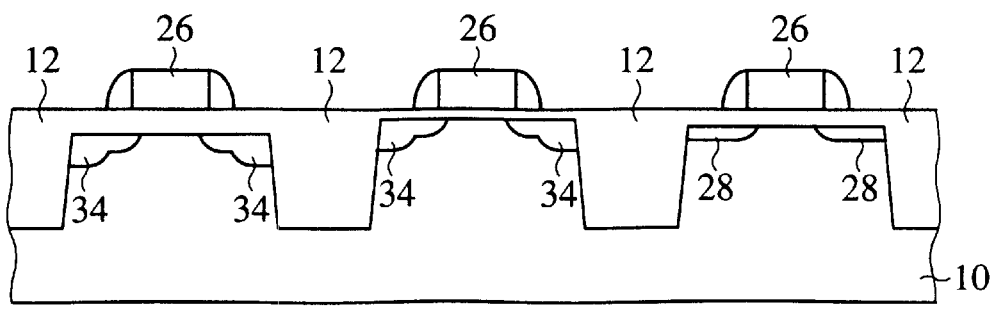

Next, gate electrodes 26, source/drain diffused layers 28, 34, etc. are formed in the same way as in the method for fabricating the semiconductor device according to the first embodiment (FIG. 20C).

As described above, according to the present embodiment, the thermal oxidation for forming the gate insulation films is performed after fluorine ions are selective implanted, whereby the gate insulation films in the regions with the fluorine ions implanted can be thick. Different doses of fluorine ions are implanted in the regions, whereby the gate insulation films can be different in thickness among the regions. The gate insulation films are formed by the wet oxidation, whereby the gate insulation films can have improved reliability than that formed by the dry oxidation.

In the present embodiment, an ion species for enhancing the enhanced oxidation is provided by fluorine ions, but in place of fluorine ions, halogen ions, such as iodine ions, etc., or xenon ions may be used.

In the present embodiment, three gate insulation films which have different thicknesses from each other are formed, but four or more gate insulation films having different thicknesses from one another may be formed.

A Third Embodiment

The method for fabricating the semiconductor device according to a third embodiment of the present invention will be explained with reference to FIGS. 21A–21C and 22A–22C. The same members of the present embodiment as those of the method for fabricating the semiconductor device according to the first and the second embodiments are represented by the same reference numbers not to repeat or to simplify their explanation, FIGS. 21A–21C and 22A–22C are sectional views of a semiconductor device in the steps of the method for fabricating the same according to the present embodiment, which show the method.

Figure 21A:
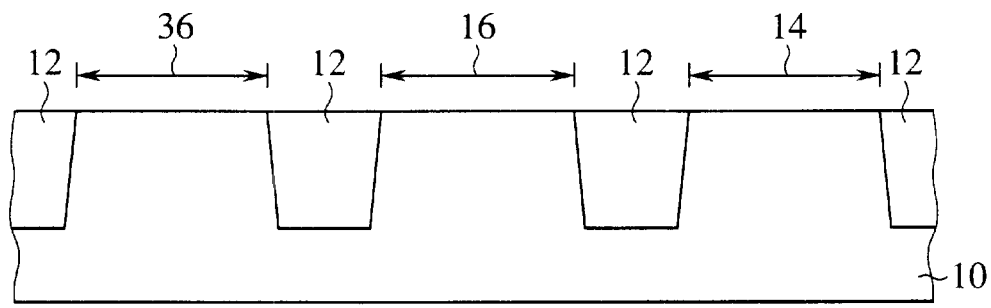
FIGS. 21A–21C and 22A–22C are sectional views of a semiconductor device in the steps of the method for fabricating the same according to a third embodiment of the present invention, which show the method.

First a device isolation film 12 buried in a silicon substrate 10 is formed by, e.g., shallow trench technique. The device isolation film 12 defines device regions 36, 14, 16 (FIG. 21A).

Figure 21B:
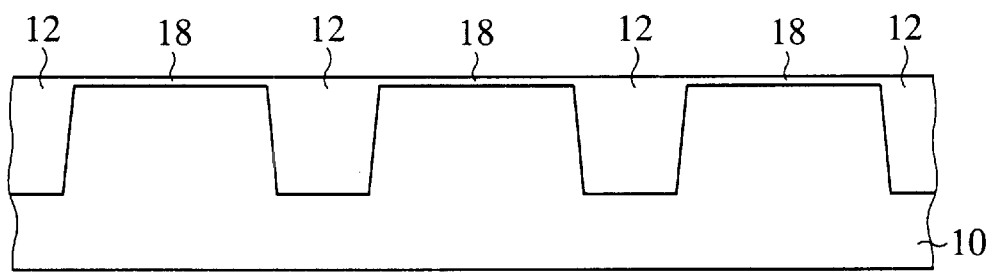

Next, a sacrificial oxidation film 18 of, e.g., about 6 nm-thick silicon oxide film is formed on the device regions 14, 16, 36 defined by the device isolation film 12 (FIG. 21B).

Next, a photoresist film 46 exposing the device region 36 and covering the device regions 14, 16 is formed by the usual photolithography.

Figure 21C:
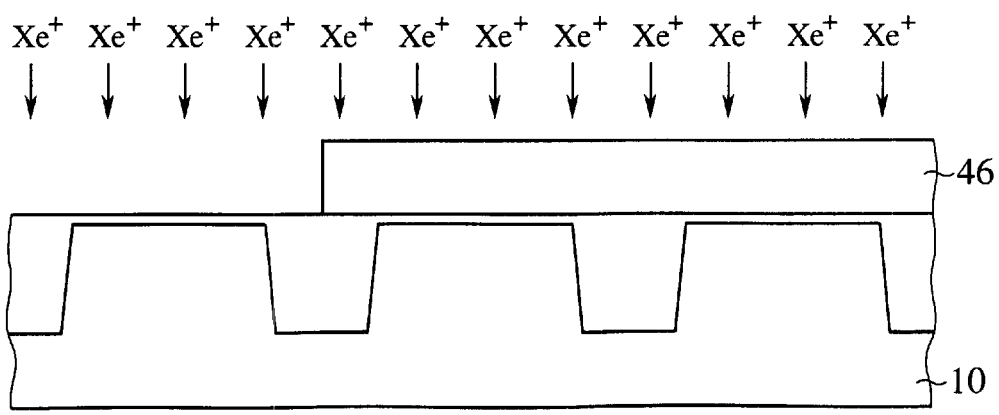

Then, with the photoresist film 46 as a mask, xenon ions are implanted in the silicon substrate 10. The xenon ions are implanted, e.g., at 10 keV acceleration energy and a $5 \times 10^{14}$ $cm^{-3}$ dose (FIG. 21C)

Next, after the photoresist film 46 is removed, a photoresist film 48 exposing the device region 14 and covering the device regions 16, 36 is formed by the usual photolithography.

Figure 22A:
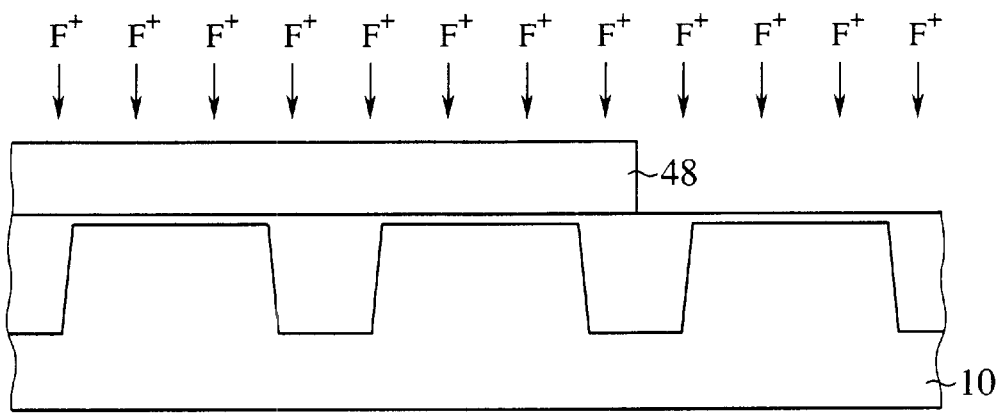

Then, with the photoresist film 48 as a mask, fluorine ions are implanted in the silicon substrate 10. Fluorine ions are implanted, e.g., at 5 keV acceleration energy and a $5 \times 10^{14}$ $cm^{-2}$ dose (FIG. 22A).

Next, after the photoresist film 48 is removed, the sacrificial oxidation film 18 is removed by wet etching using a hydrofluoric acid based aqueous solution.

Figure 22B:
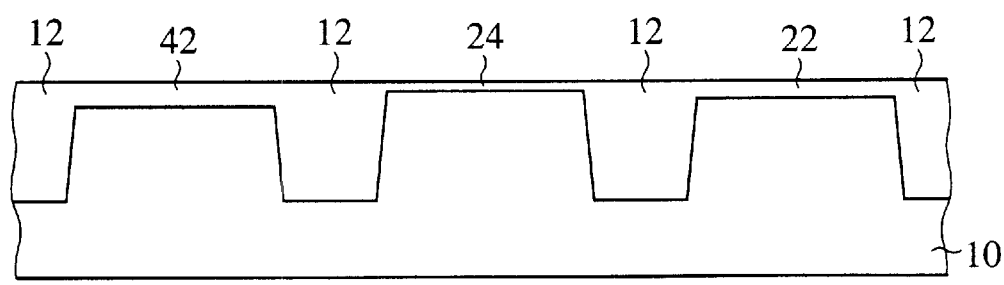

Then, the silicon substrate 10 is thermally oxidized by the low pressure wet oxidation to form a gate insulation film 22 of silicon oxide film on the device region 14, a gate insulation film 24 of the silicon oxide film on the device region 16 and a gate insulation film 42 of the silicon oxide film on the device region 36. At this time, xenon ions are implanted in the device region 36, and fluorine ions are implanted in the device region 14, and the enhanced oxidation takes place in the device regions 36, 14. The enhanced oxidation is more enhanced in the device region 36 than in the device region 14, whereby the gate insulation film 42 in the device region 36 is formed thick, the gate insulation film 24 in the device region 16 is formed thin, and the gate insulation film 22 in the device region 14 is formed thinner than the gate insulation film 42 but thicker than the gate insulation film 24 (FIG. 22B). For example, when the thermal oxidation is performed at a 750° C. oxidation temperature, under a 40 Torr film forming chamber pressure, at a 3 liters hydrogen flow rate, a 3 liters oxygen flow rate, a 20 liters nitrogen flow rate and a 5% hydrochloric acid flow rate, and with a target film thickness of the silicon substrate without fluorine or xenon ions implanted set at 4.5 nm, the gate insulation film 42 in the device region 36 is formed of the silicon oxide film of about 6.5 nm-thick, the gate insulation film 24 in the device region 16 is formed of the silicon oxide film of about 4.5 nm-thick, and the gate insulation film 22 in the device region 14 is formed of the silicon oxide film of about 5.1 nm-thick. Thus, wet oxidation film of good quality can be formed while the effect of the enhanced oxidation owing to the ion implantation being exhibited.

Figure 22C:
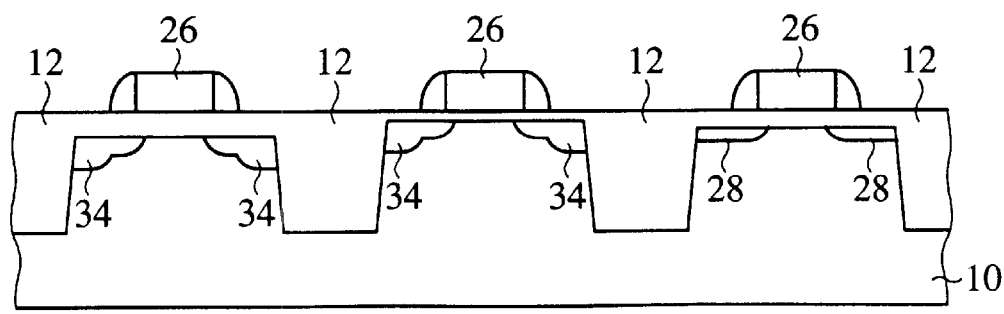

Next, gate electrodes 26, source/drain diffused layers 28, 34, etc. are formed in the same way as in the method for fabricating the semiconductor device according to the first embodiment (FIG. 22C).

As described above, according to the present embodiment, the thermal oxidation for forming the gate insulation films is performed after xenon ions and fluorine ions are selectively implanted, whereby film thicknesses of the gate insulation films in the regions with the ions implanted can be selectively increased. Xenon ions and fluorine ions, which are different in the enhanced oxidation effect, are implanted in the different regions, whereby film thicknesses of the enhanced oxidation films in the regions can be made different from one another. The gate insulation films, which are formed by the wet oxidation, can have improved reliability than those formed by the dry oxidation.

In the present embodiment, an ion species for enhancing the enhanced oxidation is provided by fluorine ions, but in place of fluorine ions, halogen ions, such as iodine ions, may be used.

In the present embodiment, the gate insulation films of three different film thicknesses are formed, but the gate insulation film of four or more different film thicknesses may be formed.

A Fourth Embodiment

The method for fabricating the semiconductor device according to a fourth embodiment of the present invention will be explained with reference to FIGS. 23A–23C and 24A–24C. The same members of the present embodiment as those of the method for fabricating the semiconductor device according to the first to the third embodiments are represented by the same reference numbers not to repeat or to simplify their explanation.

FIGS. 23A–23C and 24A–24C are sectional views of a semiconductor device in the steps of the method for fabricating the same according to the present embodiment, which show the method.

Figure 23A:
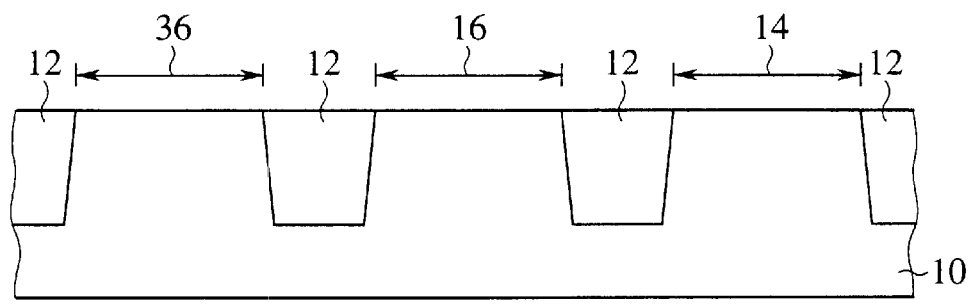
FIGS. 23A–23C and 24A–24C are sectional views of a semiconductor device in the steps of the method for fabricating the same according to a fourth embodiment of the present invention, which show the method.

First, a device isolation film 12 buried in a silicon substrate 10 is formed by, e.g., shallow trench technique. The device isolation film 12 defines device regions 36, 14, 16 (FIG. 23A).

Figure 23B:
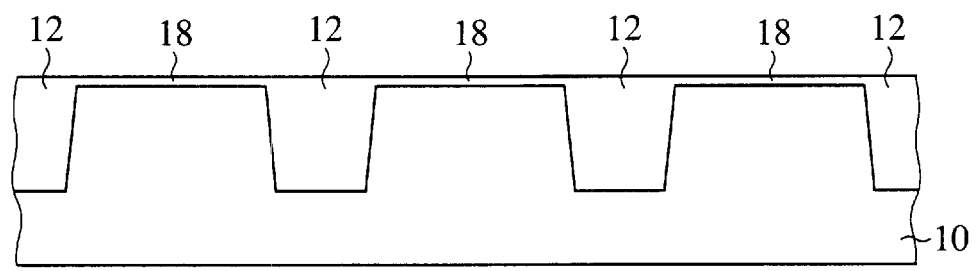

Next, a sacrificial oxidation film 18 of, e.g., about 6 nm-thick silicon oxide film is formed in the device regions 36, 14, 16 (FIG. 23B).

Then, a photoresist film 46 exposing the device region 36 and covering the device regions 14, 16 is formed by the usual photolithography.

Figure 23C:
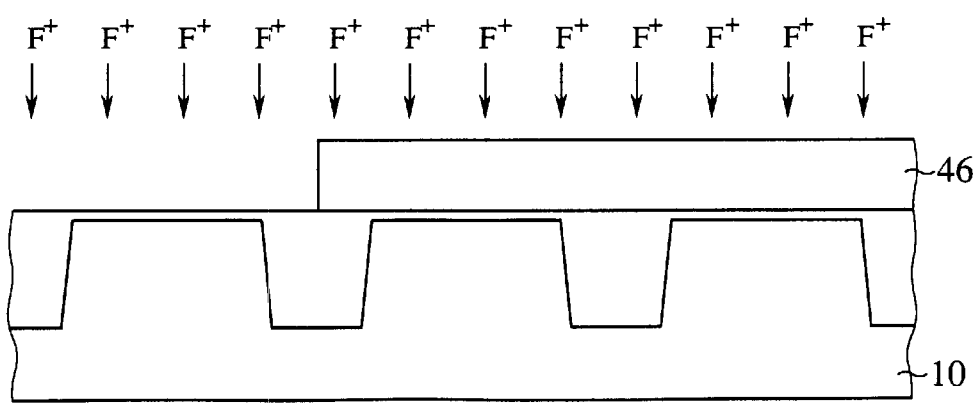

Next, with the photoresist film 46 as a mask, fluorine ions are implanted in the silicon substrate 10. The fluorine ions are implanted, e.g., at 5 keV acceleration energy and a $5 \times 10^{14}$ cm$^{-2}$ dose (FIG. 23C)

Then, after the photoresist film 46 is removed, a photoresist film 44 exposing the device region 16 and covering the device regions 36, 14 is formed by the usual photolithography.

Figure 24A:
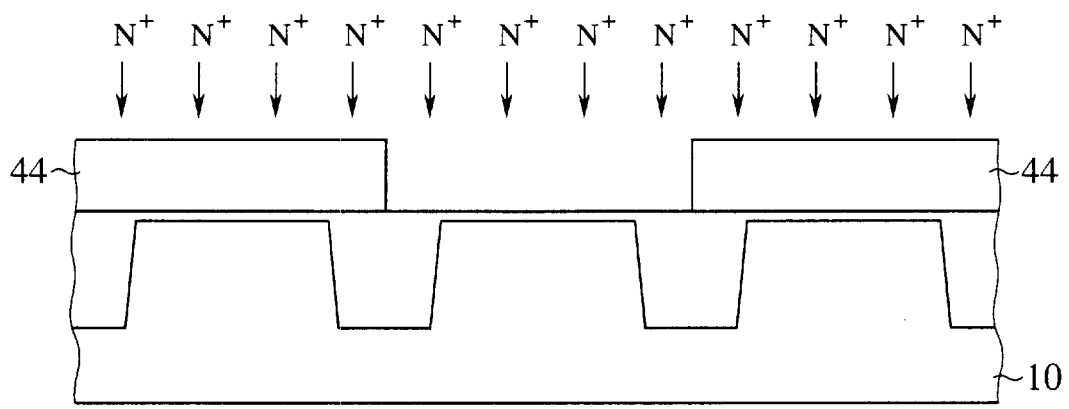

Next, with the photoresist film 44 as a mask, nitrogen ions are implanted in the silicon substrate 10. The nitrogen ions (N$^+$) are implanted, e.g., at 5 keV acceleration energy and at a $4 \times 10^{14}$ cm$^{-2}$ dose (FIG. 24A).

Next, after the photoresist film 44 is removed, the sacrificial oxidation film 18 is removed by wet etching using a hydrofluoric acid based aqueous solution.

Figure 24B:
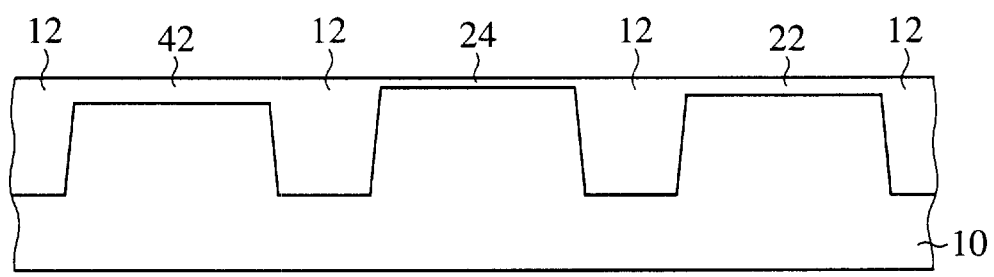

Then, the silicon substrate 10 is thermally oxidized by thermal oxidation combing the dry oxidation and the low pressure wet oxidation to form a gate insulation film 22 of the silicon oxide film in the device region 14, a gate insulation film 24 of the silicon oxide film in the device region 16 and a gate insulation film 42 of the silicon oxide film in the device region 36. At this time, fluorine ions are incorporated in the device region 36, and nitrogen ions are incorporated in the device region 16, whereby the enhanced oxidation takes place in the device region 36, and the retarded oxidation takes place in the device region 16. Accordingly, the gate insulation film 42 in the device region 36 is formed thick, the gate insulation film 24 in the device region 16 is formed thin, and the gate insulation film in the device region 14 is formed thinner than the gate insulation film 42 but thicker than the gate insulation film 22 (FIG. 24B). For example, when the dry oxidation for forming a 4 nm-thick silicon oxide film at 750° C. is followed by the low pressure wet oxidation at a 750° C. oxidation temperature, under a 40 Torr film forming chamber pressure, at a 3 liters hydrogen flow rate, a 3 liters oxygen flow rate, a 20 liters nitrogen flow rate and a 5% hydrochloric acid flow rate, and with a target film thickness of the silicon substrate without fluorine or nitrogen ions implanted set at 4.5 nm, the gate insulation film 42 in the device region 36 is formed of the silicon oxide film of about 6.8 nm-thick, the gate insulation film 24 in the device region 16 is formed of the silicon oxide film of about 4.0 nm-thick, and the gate insulation film 22 in the device region 14 is formed of the silicon oxide film of about 5.5 nm-thick. Thus, wet oxidation film of good quality can be formed while the effect of the enhanced oxidation owing to the ion implantation being exhibited.

Figure 24C:
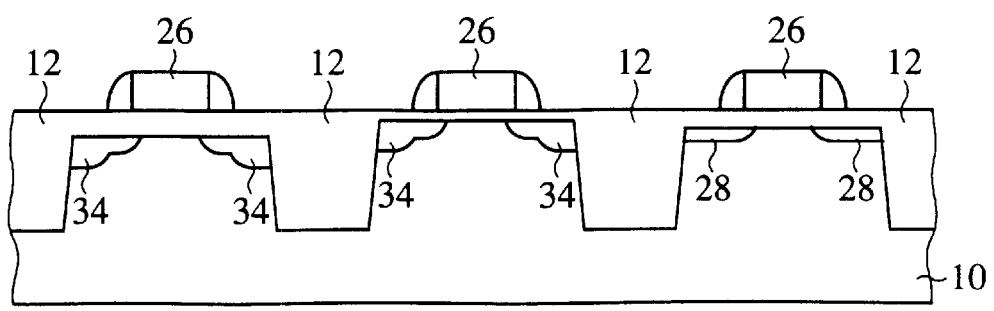

Next, gate electrodes 26, source/drain diffused layers 28, 34, etc. are formed in the same way as in the method for fabricating the semiconductor device according to the first embodiment (FIG. 24C).

As described above, according to the present embodiment, after fluorine ions and nitrogen ions are selectively implanted, the thermal oxidation combining the dry oxidation and the low pressure wet oxidation is performed as the thermal oxidation for forming the gate insulation film, whereby film thicknesses of the gate insulation films in the ion implanted regions can be selectively increased or decreased. The gate insulation films are formed by the wet oxidation, whereby the gate insulation films can have higher reliability than those formed by the dry oxidation.

In the present embodiment, an ion species for enhancing the enhanced oxidation is fluorine ions, but in place of fluorine ions, halogen ions, such as iodine ions or others, may be used.

In the present embodiment, by the oxidation in which the dry oxidation is followed by the wet oxidation, the gate insulation films are formed, but the gate insulation films may be formed by the low pressure wet oxidation in a case that the retarded oxidation by nitrogen can be less.

In the present embodiment, the gate insulation films of three different film thicknesses are formed, but gate insulation film of four or more different film thicknesses may be formed.

A Fifth Embodiment

The method for fabricating the semiconductor device according to a fifth embodiment of the present invention will be explained with reference to FIGS. 25A–25D. The same members of the present embodiment as those of the method for fabricating the semiconductor device according to the first to the fourth embodiments of the present invention shown in FIGS. 7A to 24C are represented by the same reference numbers not to repeat or to simplify their explanation.

FIGS. 25A–25D are sectional views of the semiconductor device in the steps of the method for fabricating the same according to the present embodiment, which show the method.

Figure 25A:
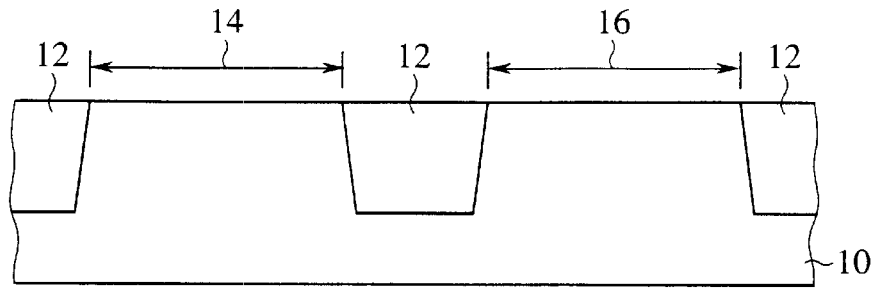
FIGS. 25A–25D are sectional views of a semiconductor device in the steps of the method for fabricating the same according to a fifth embodiment of the present invention, which show the method.

First, a device isolation film 12 buried in a silicon substrate 10 is formed by, e.g., shallow trench technique. The device isolation film 12 defines device regions 14, 16 (FIG. 25A).

Figure 25B:
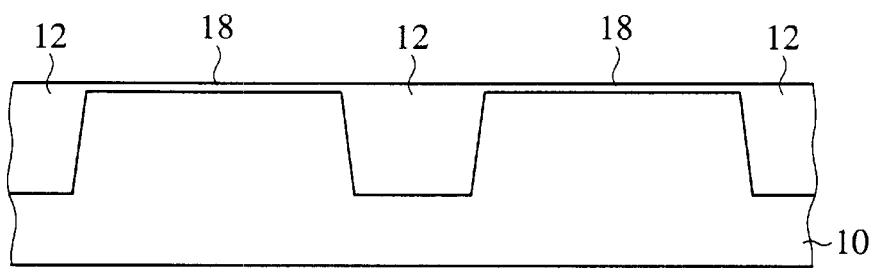
Figure 25C:
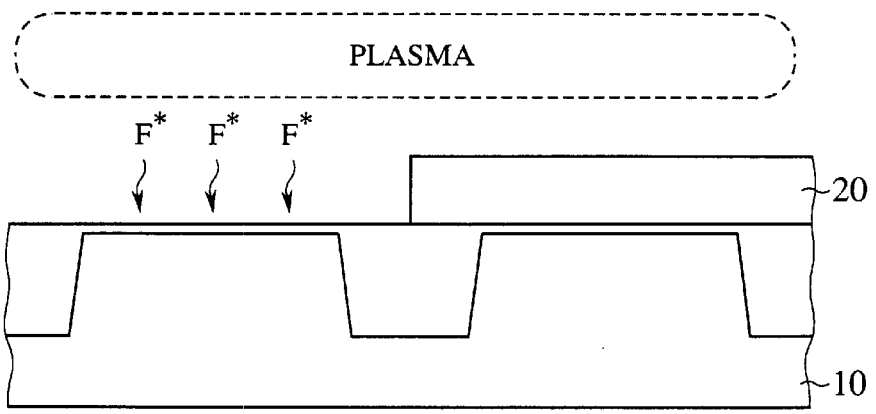

Next, a sacrificial oxidation film 18 of, e.g., about 6 nm-thick silicon oxide film is form by thermal oxidation in the device regions 14, 16 defined by the device isolation film 12 (FIG. 25B)

Next, a photoresist film 20 exposing the device region 14 and covering the device region 16 is formed by the usual photolithography. The photoresist film 20 is formed of a material which has etching resistance to a gas containing a halogen element.

Next, the silicon substrate with the photoresist 20 formed on is exposed to fluorine plasma to incorporate fluorine selectively in the device region 14 of the silicon substrate 10.

For example, the silicon substrate 10 is introduced in to a vacuum system for magnetron plasma processing, and then a fluorine content gas, e.g., $F_2$ gas, is introduced into the vacuum system. Then, a substrate bias is applied to the back side of the silicon substrate 10 under a 0.01–10 Pa pressure to establish a negative voltage within 1 kV. Concurrently therewith, introducing electromagnetic waves of 200–2000 W of rf (e.g. 13.56 MHz) or microwaves are introduced into parallel plate electrodes to cause discharges, and the silicon substrate 10 is exposed to the plasma for about 10 seconds—about 3 minutes. Thus fluorine is incorporated in the silicon substrate 10.

Next, the photoresist film 20 is removed, and then the sacrificial oxidation film 18 is removed by wet etching using a hydrofluoric acid based aqueous solution.

Figure 25D:
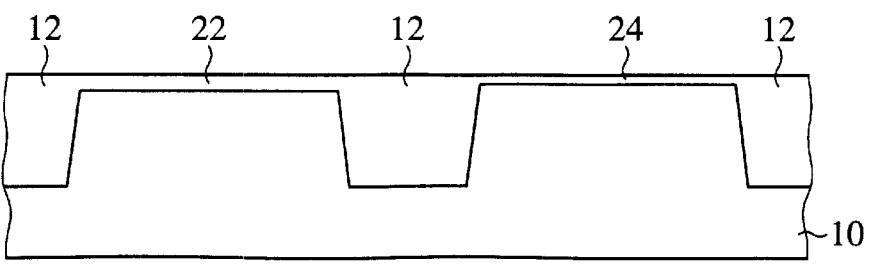

Next, the silicon substrate is thermally oxidized by the low pressure wet oxidation to form a gate insulation film 22 of the silicon oxide film in the device region 14 and a gate insulation film 24 of the silicon oxide film in the device region 16. At this time, in the device region 14, where fluorine ions are incorporated, the enhanced oxidation takes place. Thus, the gate insulation film 22 in the device region 14 is formed thick, and the gate insulation film in the device region 16 is formed thin (FIG. 25D). Thus, while the enhanced oxidation effect owing to the fluorine plasma processing is exhibited, wet oxidation film of good quality can be formed.

Then, in the same way as in the method for fabricating the semiconductor device according to, e.g., the first embodiment shown in FIGS. 18A to 18C, transistors including the gate insulation films 22, 24 having different film thicknesses from each other are formed in the device regions 14, 16.

As described above, according to the present embodiment, after the fluorine plasma processing is selectively performed, the thermal oxidation for forming the gate insulation films is performed, whereby a film thickness of the gate insulation film in the region subjected to the fluorine plasma processing can be selectively increased. The gate insulation films, which are formed by the wet oxidation, can have higher reliability than those formed by the dry oxidation.

In the present embodiment, in place of applying rf or microwaves, electron beams may be applied to ionize fluorine to apply the fluorine ions to the silicon substrate 10.

In the present embodiment, as a fluorine content gas, $F_2$ gas is used, but, for example, ArF, KrF, XeF or other gases may be used. In place of fluorine, iodine or chlorine (Cl) or bromine (Br) may be incorporated, and, in this case, for example, a gas of $Cl_2$, ArCl, KrCl, XeCl, $Br_2$, ArBr, KrBr, XeBr, $I_2$, ArI, KrI, XeI, or others can be used.

In the same way as in the second to the fourth embodiments, gate insulation films of 3 or more different film thicknesses may be formed.

Modifications

The present invention is not limited to the above-described embodiments and can cover other various modifications.

For example, in the above-described embodiments, the region for the thick gate insulation film to be formed in and the region for the thin gate insulation film to be formed in are the memory cell region and the peripheral circuit region, but are not essentially the memory cell region and the peripheral circuit region. For example, the memory cell region may be a region for the thin gate insulation film to be formed, and the peripheral circuit region is a region for the thick gate insulation film to be formed in. A region for high breakdown voltage input/output transistors to be formed in may have a thicker gate insulation film than other regions. It is preferable that regions for gate insulation films of different film thicknesses are selected suitably for device structures.

In the above-described embodiments, the present invention are explained by means of fabricating n-type transistors, but the present invention may be applied to forming the gate insulation films of p-type transistors. It is possible that gate insulation films are different in film thickness between n-type transistors and p-type transistors.

In the above-described embodiments, the present invention is applied to forming the gate insulation films but is applicable widely to forming insulation films of different film thicknesses by a single oxidation step. For example, for non-volatile memories, such as flash EEPROM, etc., it is necessary that a thin device isolation film is formed in the memory cell regions for the purpose of micronization, and a thick device isolation film is formed in the peripheral circuit region because peripheral circuits require high breakdown voltage units, such as charge pump circuits. Accordingly, the present invention is applied to a thermal oxidation step for forming the device isolation films, whereby the device isolation films of different film thicknesses can be simultaneously formed by a single thermal oxidation step.

As described above, according to the present invention, after halogen ions are selectively implanted, the thermal oxidation for forming gate insulation films is performed, whereby the gate insulation film in a region with the halogen ions implanted can be selectively formed thick. The gate insulation films are formed by the wet oxidation, whereby the gate insulation films can be more reliable than those formed by the dry oxidation. Especially by using fluorine as halogen ions, the silicon oxide film can have higher reliability than that formed without ion implantation.

After xenon ions are selectively implanted, the thermal oxidation for forming gate insulation films is performed, whereby the gate insulation film in the ion-implanted region can be selectively formed thick.

After nitrogen ions are selectively implanted, thermal oxidation combining the dry oxidation and low pressure wet oxidation is performed as the thermal oxidation for forming gate insulation films, whereby the gate insulation film in the ion implanted region can be selectively formed thin. The gate insulation films are formed by the wet oxidation, whereby the gate insulation films can be more reliable than those formed by the dry oxidation.

What is claimed is:

1. A method for fabricating the semiconductor device comprising the steps of:

selectively introducing a halogen element or argon into a first region of a silicon substrate; and wet oxidizing the silicon substrate in an ambient atmosphere which an $H_2O$ partial pressure is less than 1 atm to thereby simultaneously form a first silicon oxide film in the first region of the silicon substrate, and a second silicon oxide film thinner than the first silicon oxide film in a second region of the silicon substrate different from the first region.

2. A method for fabricating the semiconductor device according to claim 1, wherein in the step of wet oxidizing the silicon substrate, the silicon substrate is oxidized under a low pressure, or in a nitrogen atmosphere or a rare gas diluted atmosphere.

3. A method for fabricating the semiconductor device comprising the steps of:

selectively introducing iodine, krypton or xenon into a first region of a silicon substrate; and oxidizing the silicon substrate to thereby simultaneously form a first silicon oxide film in the first region, and a second silicon oxide film thinner than the first silicon oxide film in a second region of the silicon substrate different from the first region.

4. A method for fabricating the semiconductor device comprising the steps of:

selectively introducing nitrogen into a first region of a silicon substrate; and wet oxidizing the silicon substrate after dry oxidation to thereby simultaneously form a first silicon oxide film in the first region, and a second silicon oxide film thicker than the first silicon oxide film in a second region of the silicon substrate different from the first region.

5. A method for fabricating the semiconductor device comprising the steps of:

selectively introducing a halogen element or a rare gas at a first concentration into a first region of a silicon substrate;

selectively introducing a halogen element or a rare gas at a second concentration higher than the first concentration into a second region of the silicon substrate different from the first region; and wet-oxidizing the silicon substrate to thereby simultaneously form a first silicon oxide film in the first region, a second silicon oxide film thicker than the first silicon oxide film in the second region, and a third silicon oxide film thinner than the first silicon oxide film in a third region of the silicon substrate different from the first region and the second region.

6. A method for fabricating the semiconductor device comprising the steps of:

selectively introducing a halogen element or a rare gas into a first region of a silicon substrate;

selectively introducing nitrogen in a second region of the silicon substrate different from the first region; and wet-oxidizing the silicon substrate after dry oxidation to thereby simultaneously form a first silicon oxide film in the first region, a second silicon oxide film thinner than the first silicon oxide film in the second region, and a third silicon oxide film thinner than the first silicon oxide film and thicker than the second silicon oxide film in a third region of the silicon substrate different from the first region and the second region.

7. A method for fabricating the semiconductor device according to claim 1, wherein a halogen element or argon is introduced through an insulation film formed on the silicon substrate.

8. A method for fabricating the semiconductor device according to claim 3, wherein iodine, krypton or xenon is introduced through an insulation film formed on the silicon substrate.

9. A method for fabricating the semiconductor device according to claim 4, wherein nitrogen is introduced through an insulation film formed on the silicon substrate.

10. A method for fabricating the semiconductor device according to claim 5, wherein a halogen element or a rare gas is introduced through an insulation film formed on the silicon substrate.

11. A method for fabricating the semiconductor device according to claim 6, wherein a halogen element, a rare gas or nitrogen is introduced through an insulation film formed on the silicon substrate.

12. A method for fabricating the semiconductor device according to claim 1, further comprising the steps of:

forming a first gate electrode on the first silicon oxide film and a second gate electrode on the second silicon oxide film; and forming a first pair of diffused regions in the silicon substrate on both sides of the first gate electrode and a second pair of diffused regions in the silicon substrate on both sides of the second gate electrode.

13. A method for fabricating the semiconductor device according to claim 3, further comprising the steps of:

forming a first gate electrode on the first silicon oxide film and a second gate electrode on the second silicon oxide film; and forming a first pair of diffused regions in the silicon substrate on both sides of the first gate electrode and a second pair of diffused regions in the silicon substrate on both sides of the second gate electrode.

14. A method for fabricating the semiconductor device according to claim 4, further comprising the steps of:

forming a first gate electrode on the first silicon oxide film and a second gate electrode on the second silicon oxide film; and forming a first pair of diffused regions in the silicon substrate on both sides of the first gate electrode and a second pair of diffused regions in the silicon substrate on both sides of the second gate electrode.

15. A method for fabricating the semiconductor device according to claim 5, further comprising the steps of:

forming a first gate electrode on the first silicon oxide film, a second gate electrode on the second silicon oxide film, and a third gate electrode on the third silicon oxide film; and forming a first pair of diffused regions in the silicon substrate on both sides of the first gate electrode, a second pair of diffused regions in the silicon substrate on both sides of the second gate electrode, and a third pair of diffused regions in the silicon substrate on both sides of the third gate electrode.

16. A method for fabricating the semiconductor device according to claim 6, further comprising the steps of:

forming a first gate electrode on the first silicon oxide film, a second gate electrode on the second silicon oxide film, and a third gate electrode on the third silicon oxide film; and forming a first pair of diffused regions in the silicon substrate on both sides of the first gate electrode, a second pair of diffused regions in the silicon substrate on both sides of the second gate electrode, and a third pair of diffused regions in the silicon substrate on both sides of the third gate electrode.

17. A method for fabricating a semiconductor device comprising the steps of:

selectively introducing a first element selected from the group consisting of halogen elements and rare gas elements into a first region of a silicon substrate;

selectively introducing a second element selected from the group consisting of halogen elements and rare gas elements into a second region of the silicon substrate different from the first region, the second element being different than the first element; and wet-oxidizing the silicon substrate to thereby simultaneously form a first silicon oxide film in the first region, a second silicon oxide film thicker than the first silicon oxide film in the second region, and a third silicon oxide film thinner than the first silicon oxide film in a third region of the silicon substrate different from the first region and the second region.

* * * * *

UNITED STATES PATENT AND TRADEMARK OFFICE
CERTIFICATE OF CORRECTION

PATENT NO. : 6,541,393 B2
DATED : April 1, 2003
INVENTOR(S) : Sugizaki et al.

It is certified that error appears in the above-identified patent and that said Letters Patent is hereby corrected as shown below:

<u>Title page</u>,
Item [73], Assignee, "Fujitsu Limited, Kawasaki (JP)" should read
-- Kabushiki Kaisha Toshiba, Kawasaki (JP) --

Signed and Sealed this

Eleventh Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,541,393 B2
DATED : April 1, 2003
INVENTOR(S) : Sugizaki et al.

It is certified that error appears in the above-identified patent and that said Letters Patent is hereby corrected as shown below:

<u>Title page</u>,
Item [73], Assignee, "Fujitsu Limited, Kawasaki (JP)" should read -- Fujitsu Limited, Kawasaki (JP); and Kabushiki Kaisha Toshiba, Kawasaki (JP) --

This certificate supersedes Certificate of Correction issued May 11, 2004.

Signed and Sealed this

Fifteenth Day of June, 2004

JON W. DUDAS
*Acting Director of the United States Patent and Trademark Office*